(12) United States Patent
Schreiber

(10) Patent No.: US 12,096,594 B2
(45) Date of Patent: Sep. 17, 2024

(54) FLUIDIC ROUTING STRUCTURES FOR LIQUID COOLING OF POWER MODULES OF POWER SUPPLIES

(71) Applicant: The ESAB Group Inc., Annapolis Junction, MD (US)

(72) Inventor: Wilson Alexander Schreiber, Lebanon, NH (US)

(73) Assignee: THE ESAB GROUP INC., North Bethesda, MD (US)

( * ) Notice: Subject to any disclaimer, the term of this patent is extended or adjusted under 35 U.S.C. 154(b) by 189 days.

(21) Appl. No.: 17/482,534

(22) Filed: Sep. 23, 2021

(65) Prior Publication Data
US 2023/0086294 A1    Mar. 23, 2023

(51) Int. Cl.
  F28F 3/12      (2006.01)
  H01L 23/473    (2006.01)
  H05K 7/20      (2006.01)

(52) U.S. Cl.
  CPC ..... *H05K 7/20254* (2013.01); *H05K 7/20927* (2013.01)

(58) Field of Classification Search
  CPC ..... F28F 3/12; H01L 23/473; H05K 7/20927; H05K 7/2089
  See application file for complete search history.

(56) References Cited

U.S. PATENT DOCUMENTS

| 8,188,405 | B2 | 5/2012 | Martin et al. |
| 8,564,953 | B2 | 10/2013 | Horiuchi et al. |
| 9,474,185 | B2 | 10/2016 | Jochman |
| 10,150,173 | B2 | 12/2018 | Altekruse et al. |
| 10,548,246 | B2 | 1/2020 | Takeuchi et al. |
| 10,610,983 | B2 | 4/2020 | Melius et al. |
| 10,897,807 | B2 | 1/2021 | Raymond |

(Continued)

FOREIGN PATENT DOCUMENTS

| CN | 202261060 U | 5/2012 |
| CN | 106793694 A | 5/2017 |

(Continued)

OTHER PUBLICATIONS

Examination Report No. 1 for Australian Patent Application No. 2022228168 date Aug. 18, 2023, 4 pages.

(Continued)

*Primary Examiner* — Frantz F Jules
*Assistant Examiner* — Jason N Thompson
(74) *Attorney, Agent, or Firm* — Edell, Shapiro & Finnan, LLC

(57) ABSTRACT

A heat extraction assembly or apparatus includes a cooling cassette and a component coupled to a top surface of the cooling cassette. The cooling cassette may include an inlet, an outlet, and a cooling cavity disposed within the top surface of the cooling cassette. The cooling cavity may be in fluid communication with inlet and the outlet. The component may be coupled to the top surface of the cooling cassette proximate to the cooling cavity such that the component at least partially defines a boundary of the cooling cavity. Coolant flowing through the cooling cassette from the inlet to the outlet may directly contact the component at the cooling cavity in order to provide a cooling effect to regulate a temperature of the component.

19 Claims, 15 Drawing Sheets

(56) References Cited

U.S. PATENT DOCUMENTS

| | | | |
|---|---|---|---|
| 10,925,194 B2 | 2/2021 | Dessart | |
| 11,006,552 B2 | 5/2021 | Jochman | |
| 2011/0188204 A1* | 8/2011 | Horiuchi | H05K 7/20927 |
| | | | 29/527.1 |
| 2012/0287577 A1* | 11/2012 | Sevakivi | H01L 23/473 |
| | | | 165/104.33 |
| 2013/0087307 A1 | 4/2013 | Brandenburg et al. | |
| 2013/0206375 A1* | 8/2013 | Yoshida | H05K 7/20927 |
| | | | 165/170 |
| 2013/0287577 A1* | 10/2013 | Lin | B64C 39/024 |
| | | | 416/210 R |
| 2013/0314870 A1* | 11/2013 | Kwak | H05K 7/20927 |
| | | | 361/689 |
| 2014/0158324 A1* | 6/2014 | Tochiyama | H01L 23/473 |
| | | | 165/67 |
| 2014/0347818 A1* | 11/2014 | Uhlemann | H05K 7/20927 |
| | | | 361/699 |
| 2016/0136748 A1 | 5/2016 | Lee et al. | |
| 2017/0105320 A1 | 4/2017 | Park | |
| 2018/0245862 A1* | 8/2018 | Bungo | F28F 3/086 |
| 2019/0084071 A1 | 3/2019 | Altekruse et al. | |
| 2019/0122958 A1* | 4/2019 | Uneme | H05K 7/20927 |
| 2019/0343019 A1 | 11/2019 | Todorovic et al. | |
| 2020/0346309 A1* | 11/2020 | Orvedahl | B23K 9/1006 |

FOREIGN PATENT DOCUMENTS

| | | |
|---|---|---|
| DE | 202007001503 U1 | 5/2007 |
| KR | 1020100030029 A | 3/2010 |

OTHER PUBLICATIONS

Extended European Search Report for European Patent Application No. 22196842.3 dated Jun. 23, 2023, 13 pages.

* cited by examiner

FLUIDIC ROUTING STRUCTURES FOR LIQUID COOLING OF POWER MODULES OF POWER SUPPLIES

TECHNICAL FIELD

The present disclosure is directed toward welding and/or plasma cutting power supplies, in particular, devices or structures configured to cool components of the power supplies.

BACKGROUND OF THE INVENTION

Power supplies typically contain a number of power modules, devices, and other components that generate a significant amount of heat during operation. In conventional setups, the temperature of these modules, devices, and/or components are regulated through various known cooling methods and heat extraction assemblies (e.g., heat sinks, cooling plates, etc.). According to one known cooling method, the modules, devices, and/or components are affixed to a heat sink that is configured to draw the heat away from the modules, devices, and/or components. In another known cooling method, the modules, devices, and/or components are affixed to a cooling/cold plate containing a completely enclosed flow pathway through which a coolant may flow in order to cool the cooling plate, which in turn cools the modules, devices, and/or components affixed to the cooling plate.

In many of these conventional heat extraction assemblies, the modules, devices, and/or components may be affixed to the heat extraction assemblies via a thermal paste or thermal grease. The use of thermal paste, however, creates a significant stack-up of thermal resistances that makes it more difficult for the heat extraction assemblies to extract heat from the modules, devices, and/or components. If thermal paste is not applied uniformly and is not of a specific thickness, the performance and life of the module, device, and/or component will decline, which could possibly result in a failure of the power supply system in which the modules, devices and/or components are present. In addition, if the thermal paste is not applied properly, or if there are significant variations between batches of thermal paste, the heat extraction capability of the heat extraction assemblies will be reduced, which can reduce the lifespan and/or performance of the modules, devices, and/or components, as well as of the power supply system in which they are disposed.

In other conventional heat extraction assemblies, the modules, devices, and/or components may be affixed to the heat extraction assemblies via a mechanical affixing/fastening device (e.g., screws, bolts, nuts, etc.). Mechanically affixing the base of the module, device, and/or component to the heat extraction assembly must be done with care using torque (and other) specifications provided by the manufacturer in order to provide a high quality and/or adequate mechanical contact that facilitates the necessary and required heat extraction. If there are deviations in the flatness of the base of the modules, devices, and/or components, the heat extraction device itself, or if the modules, devices, and/or components are not properly torqued to the heat extraction device, a reduction in performance or premature failure of the modules, devices, and/or components may occur. Many of these tolerances can be difficult to control in a manufacturing/assembly environment, which adds both cost and time to the manufacturing/assembly of the final product.

SUMMARY OF THE INVENTION

The present disclosure is directed towards an apparatus configured to regulate the temperature of power modules/devices/components (hereinafter collectively referred to as "power components" or "components") of a power supply via liquid cooling, where the liquid coolant comes in direct contact with the power components in order to cool the power components. The power components of a power supply may be affixed to a cooling plate or cooling cassette that contains a series of coolant flow pathways. Disposed in an outer surface of the cooling plate may be one or a series of cavities, depressions, or chambers that are in fluid communication with the coolant flow pathways. Thus, coolant flowing through the coolant flow pathways may flow into, and out of the cavities. The cavities may further be disposed in the outer surface of the cooling plate such that at least one side of the cavities is open to the area surrounding the plate. The power components may be affixed to the outer surface of the cooling plate such that they are located proximate to, or directly over, the cavities. A gasket or seal may be disposed on the cooling plate such that the seal is disposed around the perimeter of the opening of the cavities, and such that the seal is between the bottom surface of the power component and the outer surface of the cooling plate. Thus, the seal and the coupling of the power component to the cooling plate seals the cavities from the area surrounding the cooling plate. Such an arrangement allows the coolant flowing through the coolant flow pathways, and into the cavities, to directly contact the bottom surface of the power components to provide a cooling or temperature regulating effect to the power components.

In one embodiment, an apparatus for regulating the temperature of the power components of a power supply includes a cooling cassette and a component coupled to the cooling cassette. The cooling cassette may contain an inlet, and outlet, and a cooling cavity that is disposed within a top surface of the cooling cassette. The cooling cavity may be in fluid communication with the inlet and the outlet. The component may be coupled to the top surface of the cooling cassette proximate to the cooling cavity such that the component defines a boundary of the cooling cavity. In addition, when coolant flows through the cooling cassette from the inlet to the outlet, the coolant contacts the component at the cooling cavity.

In some instances, the coolant flowing through the cooling cassette may directly contact the component to provide a cooling effect to regulate a temperature of the component. In some further instances, the cooling cassette may include at least a first cooling plate and a second cooling plate that are coupled together. Moreover, according to some instances, a seal may be disposed around the cooling cavity, and may be disposed between the top surface of the cooling cassette and the component.

Still further, in some instances, the cooling cavity may be a first cooling cavity, and the cooling cassette may further include a second cooling cavity disposed within the top surface of the cooling cassette and spaced from the first cooling cavity. The second cooling cavity may also be in fluid communication with the inlet and the outlet. In addition, the component may be a first component, and the apparatus may further include a second component coupled to the top surface of the cooling cassette proximate to the second cooling cavity such that the second component defines a boundary of the second cooling cavity. Furthermore, the coolant flowing through the cooling cassette from the inlet to the outlet may provide parallel cooling of the first component and the second component.

In another embodiment, an apparatus for regulating the temperature of the power components of a power supply includes a cooling plate and a component. The cooling plate may define a flow pathway where an exposed portion of the flow pathway may be disposed at an outer surface of the cooling plate. The component may be coupled to the outer surface of the cooling plate proximate to the exposed portion of the flow pathway such that the component at least partially defines the exposed portion of the flow pathway with the cooling plate. In addition, when coolant flows through the flow pathway of the cooling plate, the coolant contacts the component at the exposed portion of the flow pathway.

In some instances, the exposed portion of the flow pathway may be a first exposed portion, and the cooling plate may further include a second exposed portion of the flow pathway that is disposed at the outer surface of the cooling plate and spaced from the first exposed portion. In addition, the component may be a first component, and the apparatus may further include a second component coupled to the outer surface of the cooling plate proximate to the second exposed portion of the flow pathway such that the second component at least partially defines the second exposed portion of the flow pathway with the cooling plate. The coolant flowing through the flow pathway of the cooling plate may be in contact with the second component at the second exposed portion of the flow pathway. Furthermore, the coolant flowing through the flow pathway may provide parallel cooling of the first component and the second component.

In still some further instances, the coolant flowing through the cooling plate may directly contact the component at the exposed portion of the flow pathway to provide a cooling effect to regulate a temperature of the component. In even further instances, the apparatus may further include a seal disposed around the exposed portion of the flow pathway, and disposed between the outer surface of the cooling plate and the component.

In yet another embodiment, an apparatus for regulating the temperature of the power components of a power supply includes a cooling plate, a component, and a coolant pathway. The cooling plate may have an outer surface. The component may be coupled to the outer surface of the cooling plate. The coolant pathway may be collectively defined by the cooling plate and at least a portion of the component. In addition, coolant flowing through the coolant pathway may contact the portion of the component to regulate a temperature of the component.

In some instances, the coolant pathway may include a cooling chamber that may be disposed within the outer surface of the cooling plate and at least partially defined by the component. In addition, the coolant flowing through the coolant pathway may directly contact the component at the cooling chamber. In some further instances, the cooling chamber of the coolant pathway may be a first cooling chamber, and the cooling pathway may further include a second cooling chamber. The second cooling chamber may be disposed within the outer surface of the cooling plate, and may be spaced from the first cooling chamber. Furthermore, the component may be a first component, and the apparatus may further include a second component coupled to the outer surface of the cooling plate proximate to the second cooling chamber of the coolant pathway. The second component may at least partially define the second cooling chamber of the cooling pathway with the cooling plate. The coolant flowing through the coolant pathway of the cooling plate may be in contact with the second component at the second cooling chamber of the coolant pathway. Moreover, the coolant flowing through the coolant pathway may provide parallel temperature regulation of the first component and the second component.

In some further instances, the apparatus may further comprise a seal that may be disposed between the outer surface of the cooling plate and the component. In even further instances, the component may be a power module of a power supply.

Other systems, methods, features and advantages will be, or will become, apparent to one with skill in the art upon examination of the following figures and detailed description. All such additional systems, methods, features and advantages are included within this description, are within the scope of the claimed subject matter.

BRIEF DESCRIPTION OF THE DRAWINGS

The apparatuses, systems, devices, modules, components, cassettes, plates, and pathways, presented herein may be better understood with reference to the following drawings and description. It should be understood that some elements in the figures may not necessarily be to scale and that emphasis has been placed upon illustrating the principles disclosed herein. In the figures, like-referenced numerals designate corresponding parts/steps throughout the different views.

DETAILED DESCRIPTION OF THE INVENTION

Figure 1A:
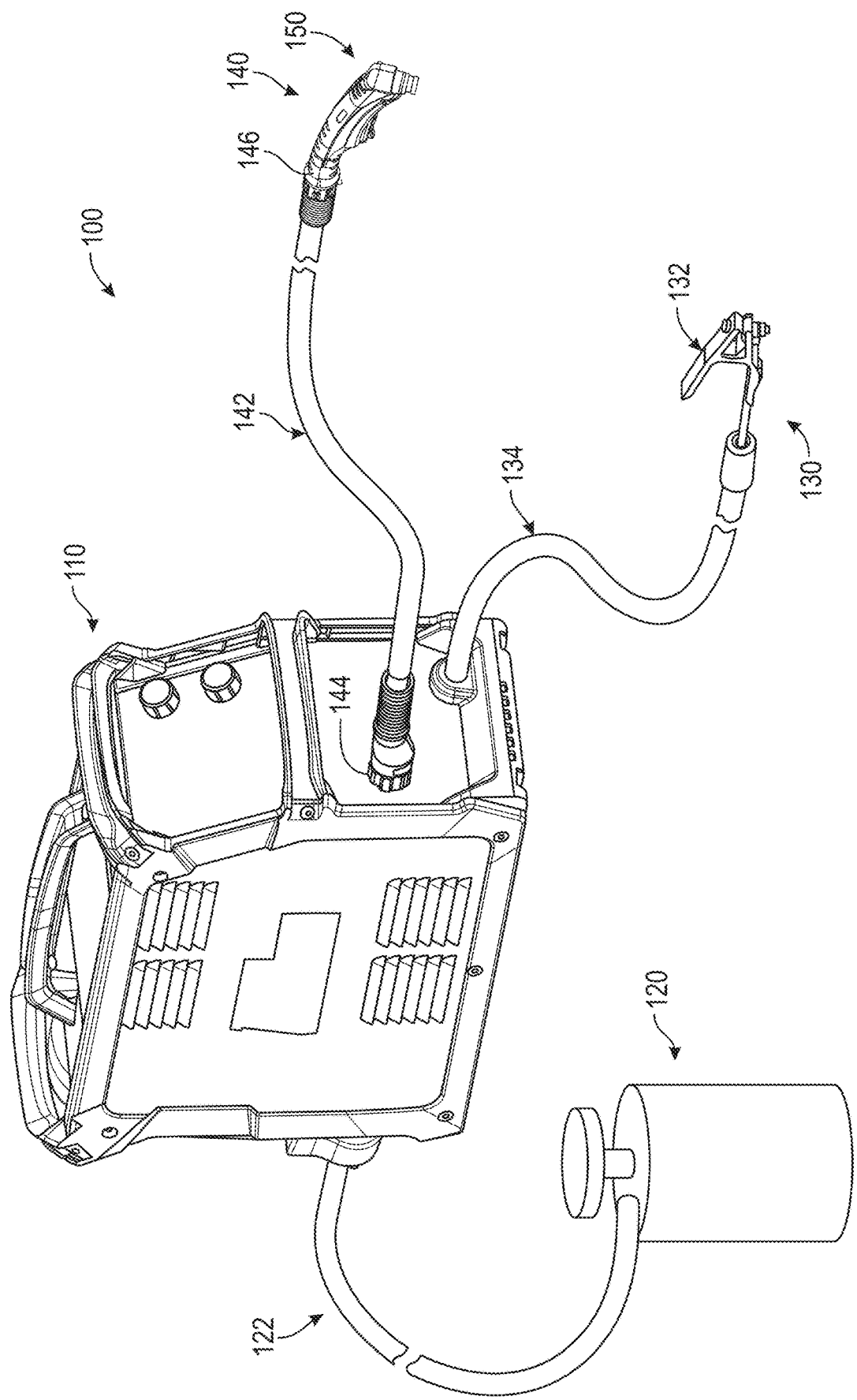
FIG. 1A illustrates a perspective view of a manual cutting system including a power source and torch assembly, according to an example embodiment of the present disclosure.

The present invention is directed to an apparatus configured to regulate the temperature of power modules/devices/components (hereinafter collectively referred to as "power components" or "components") of a power supply via liquid cooling, where the liquid coolant comes in direct contact with the power components in order to cool the power components. The power components of a power supply may be affixed to a cooling plate or cooling cassette that contains a series of coolant flow pathways. Disposed in an outer surface of the cooling plate may be one or a series of cavities, depressions, or chambers that are in fluid communication with the coolant flow pathways. Thus, coolant flowing through the coolant flow pathways may flow into, and out of the cavities. The cavities may further be disposed in the outer surface of the cooling plate such that at least one side of the cavities is open to the area surrounding the plate. The power components may be affixed to the outer surface of the cooling plate such that they are located proximate to, or directly over, the cavities. A gasket or seal may be disposed on the cooling plate such that the seal is disposed around the perimeter of the opening of the cavities, and such that the seal is between the bottom surface of the power component and the outer surface of the cooling plate. Thus, the seal and the coupling of the power component to the cooling plate seals the cavities from the area surrounding the cooling plate. Such an arrangement allows the coolant flowing through the coolant flow pathways, and into the cavities, to directly contact the bottom surface of the power components to provide a cooling or temperature regulating effect to the power components.

In the following detailed description, reference is made to the accompanying figures which form a part hereof wherein like numerals designate like parts throughout, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the description herein. Alternate embodiments of the present disclosure and their equivalents may be devised without parting from the spirit or scope of the present disclosure. It should be noted that any discussion herein regarding "one embodiment", "an embodiment", "an exemplary embodiment", and the like indicate that the embodiment described may include a particular feature, structure, or characteristic, and that such particular feature, structure, or characteristic may not necessarily be included in every embodiment. In addition, references to the foregoing do not necessarily comprise a reference to the same embodiment. Finally, irrespective of whether it is explicitly described, one of ordinary skill in the art would readily appreciate that each of the particular features, structures, or characteristics of the given embodiments may be utilized in connection or combination with those of any other embodiment discussed herein.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "comprising," "including," "having," and the like, as used with respect to embodiments of the present disclosure, are synonymous.

FIG. 1A illustrates an example embodiment of a manual cutting system 100 that may utilize a plasma arc torch and a power supply. While FIG. 1A illustrates a manual cutting system 100, the present invention shall not be limited to manual cutting systems. The present invention disclosed herein may also be applicable to automated cutting systems (e.g., robotic cutting systems/automated cutting systems like that illustrated in FIG. 1C), welding systems, and any other system that requires a power supply. The cutting system 100 illustrated in FIG. 1A is intended for illustrative purposes only. At a high-level, the cutting system 100 may include a power supply 110 and a torch assembly 140. The power supply 110 may be configured to supply (or at least control the supply of) power and gas to a torch 150 included in the torch assembly 140 via torch lead 142 (also referred to as cable hose 142). For example, the power supply 110 may meter a flow of gas received from a gas supply 120, which the power supply 110 receives via cable hose 122, before or as the power supply 110 supplies gas to the torch 150 via cable hose 142.

The cutting system 100 may also include a working lead assembly 130 with a grounding clamp 132 that is connected to the power supply by a work lead 134 (also referred to as cable hose 134). As illustrated, cable hose 122, cable hose 134, and cable hose 142 may each be any length. Moreover, each end of cable hose 122, cable hose 134, and cable hose 142 may be connected to components of the cutting system 100 via any connectors now known or developed hereafter (e.g., via releasable connectors). For example, torch 150 may be connected to a distal end of cable hose 142 via a quick disconnect connector 146 and power supply 110 may be connected to a proximal end of cable hose 142 via a quick disconnect connector 144.

Figure 1B:
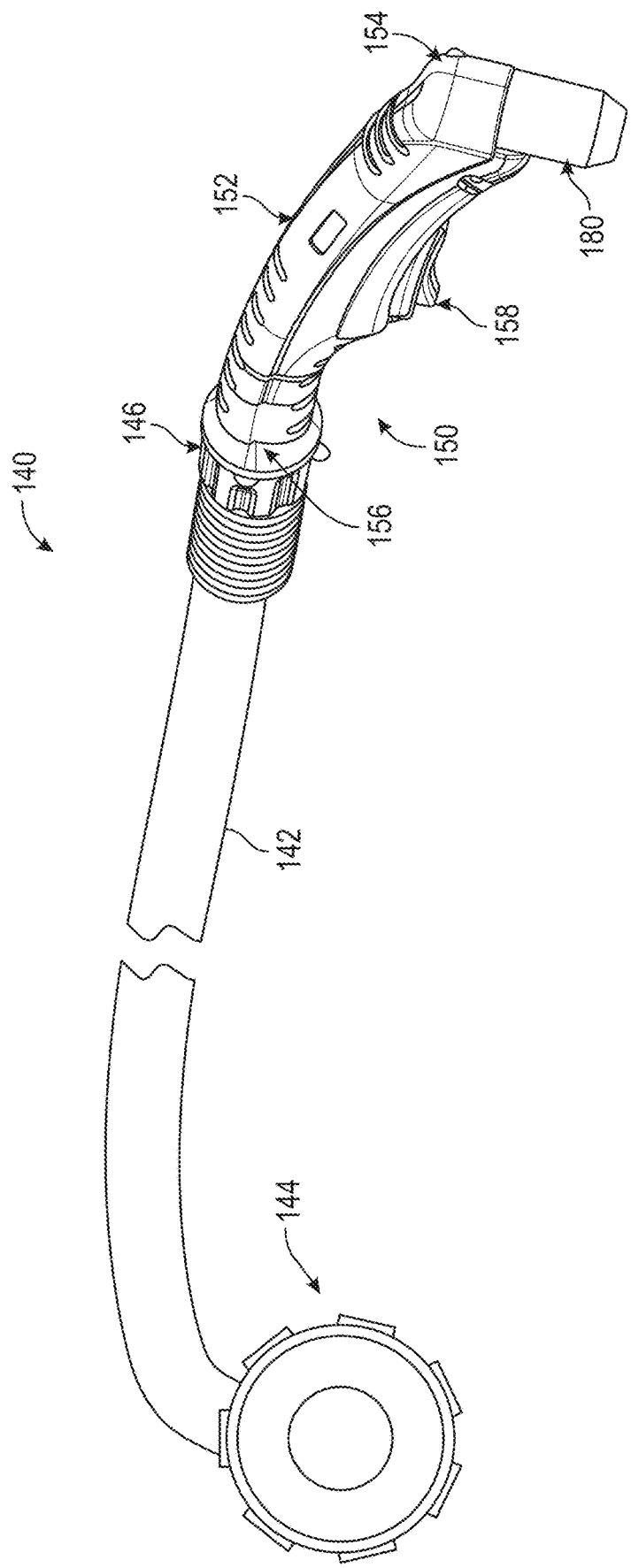
FIG. 1B is a perspective of the manual torch assembly of FIG. 1A.

FIG. 1B illustrates the torch assembly 140 of FIG. 1A independent from the power supply 110. As can be seen, the torch 150 includes a torch body 152 that extends from a first end 156 (e.g., a connection end 156) to a second end 154 (e.g., an operating or operative end 154). The torch body 152 may also include a trigger 158 that allows a user to initiate cutting operations in any manner now known or developed hereafter (e.g., in a 2T or 4T mode). As mentioned above, the connection end 156 of the torch body 152 may be coupled (in any manner now known or developed hereafter) to one end of lead 142. Meanwhile, the operative end 154 of the torch body 152 may receive interchangeable components 180, such as consumable components that facilitate cutting operations. The consumable components, which is depicted installed on torch 150 in FIG. 1B, may also be referred to as a consumable stack 180, and the depiction shown in FIG. 1B is merely a non-limiting representative example of a consumable stack.

Figure 1C:
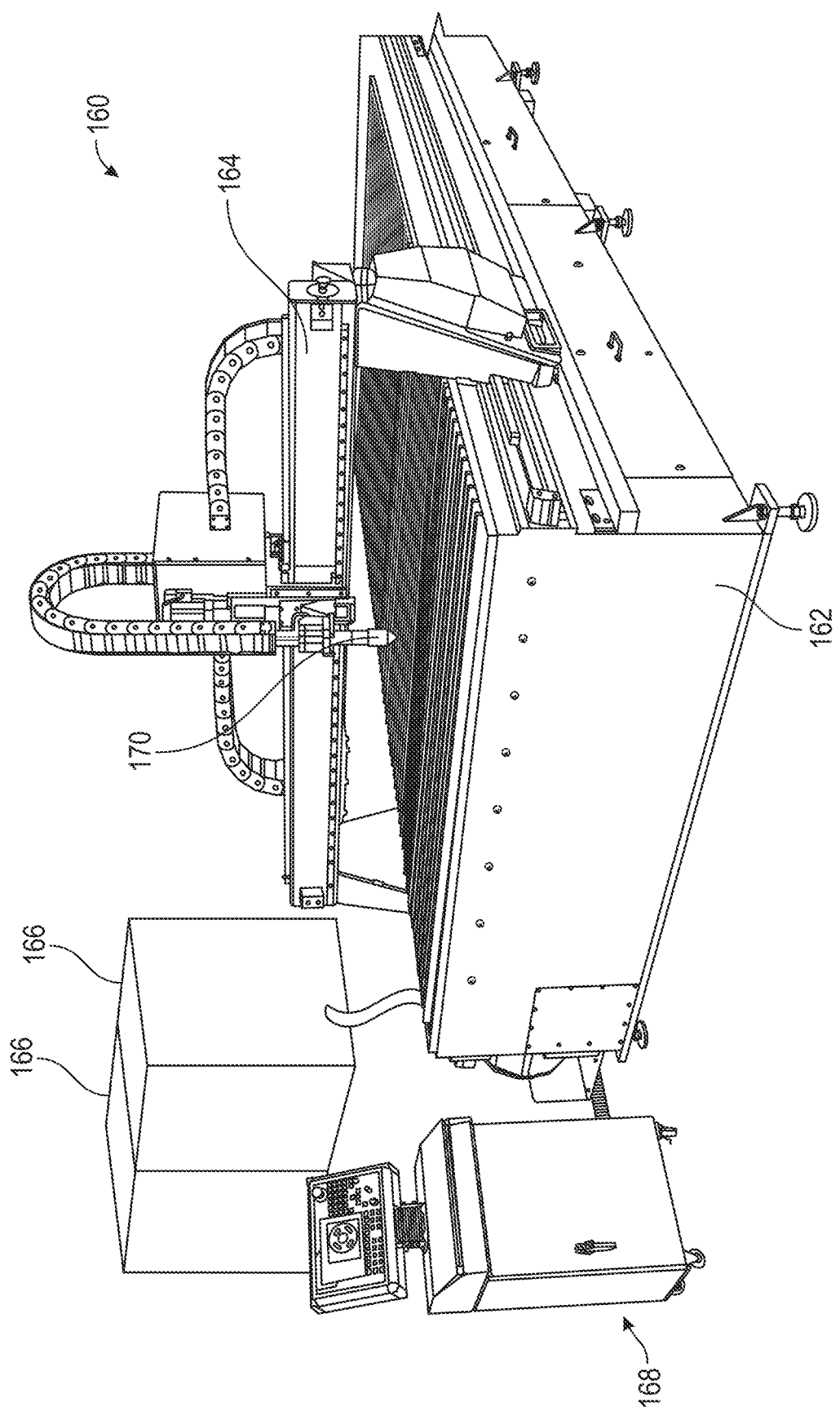
FIG. 1C is a perspective view of an automated cutting system including a power source and torch assembly, according to an example embodiment of the present disclosure.

Turning to FIG. 1C, illustrated is an example embodiment of an automated cutting system 160 in accordance with the teachings of the present disclosure. As shown, the automated cutting system 160 includes a table 162 configured to receive a workpiece (not shown), such as, but not limited to, sheets of metal. The automated cutting system may further include a positioning system 164 that is mounted to the table 162 and configured to translate or move along the table 162. At least one automated plasma arc torch 170 is mounted to the positioning system 164 and, in some embodiments, multiple automated plasma arc torches 170 may be mounted to the positioning system 164.

As further shown in FIG. 1C, at least one power supply 166 is operatively connected to the automated plasma arc torch 170, wherein the power supply 166 provides electrical power and fluid flow to the automated plasma arc torch 170 for operation. In another embodiment, a separate fluid supply unit (not shown) or units may be provided rather than providing fluid flow from the power supply 166. As used herein, the term "fluid" shall be construed to include a gas or a liquid. As also shown in FIG. 1C, a controller or control panel 168 is operatively coupled to and in communication with the automated plasma arc torch 170, the power supply 166, and the positioning system 164, where the controller 168 is configured to control the operations of the automated plasma arc torch 170, the power supply 166, and the positioning system 164.

Figure 1D:
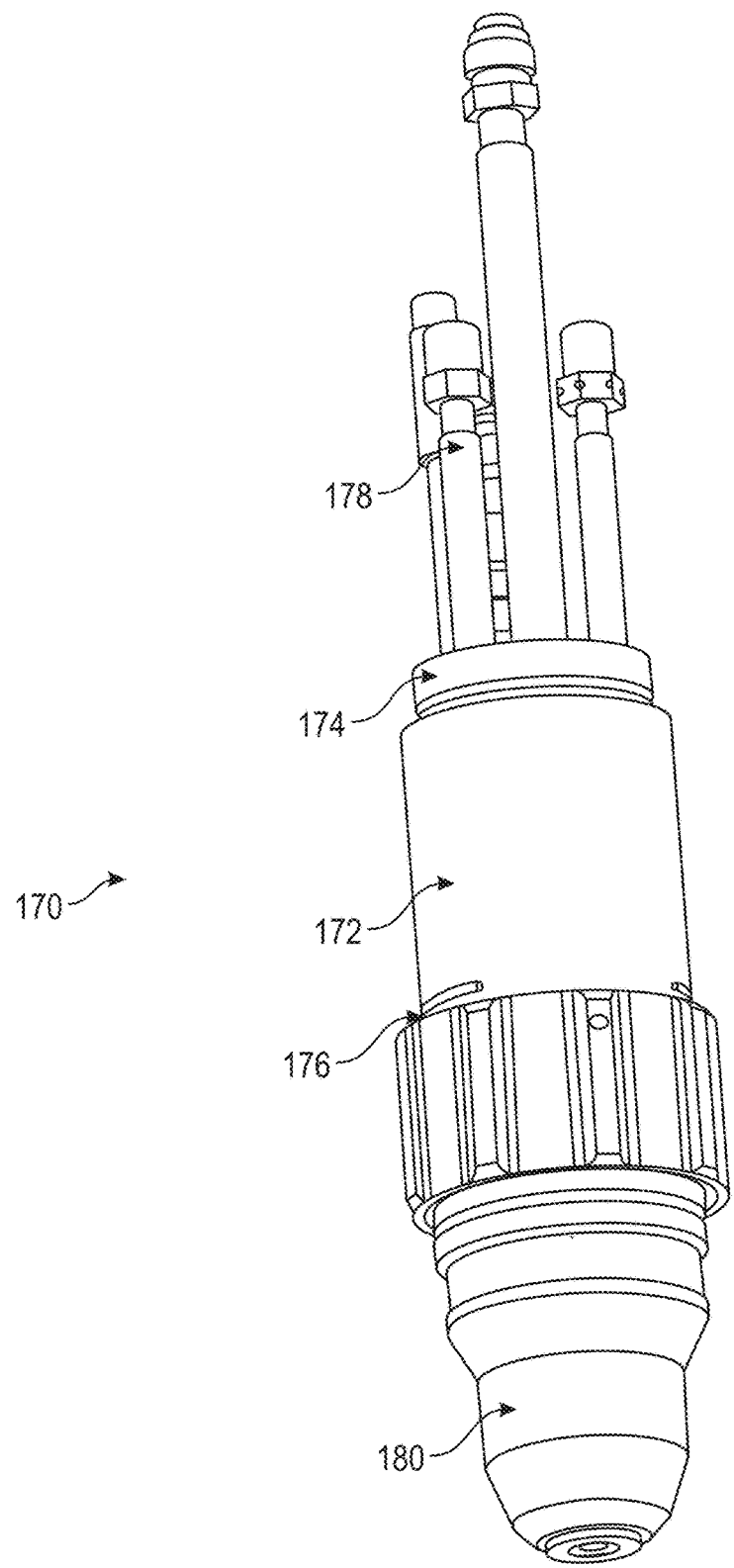
FIG. 1D is perspective view of an automated cutting head of the automated cutting system illustrated in FIG. 1C.

Turning to FIG. 1D, illustrated an example embodiment of the automated plasma arc torch 170 illustrated in FIG. 1C, where the automated plasma arc torch may utilize the interchangeable components 180, such as consumable components that facilitate cutting operations. As can be seen, the automated plasma arc torch 170 includes a body 172 that extends from a first end 174 (e.g., a connection end 174) to a second end 176 (e.g., an operating or operative end 176). The connection end 174 of the body 172 may be coupled (in any manner now known or developed hereafter) to the positioning system 164, and the conduits 178 extending from the connection end 174 may be coupled to like conduits in or connected to the positioning system 164 to operatively connect the automated plasma arc torch 170 to a power supply, a gas supply, a coolant supply, and/or any other components supporting automated cutting operations. Meanwhile, the operative end 176 of the body 174 may receive the interchangeable components 180, including consumable components that facilitate cutting operations. Again, the consumable stack 180 depicted in FIG. 1D is merely a non-limiting representative example of a consumable stack (like that of the stack 180 depicted in FIG. 1B).

Figure 2:
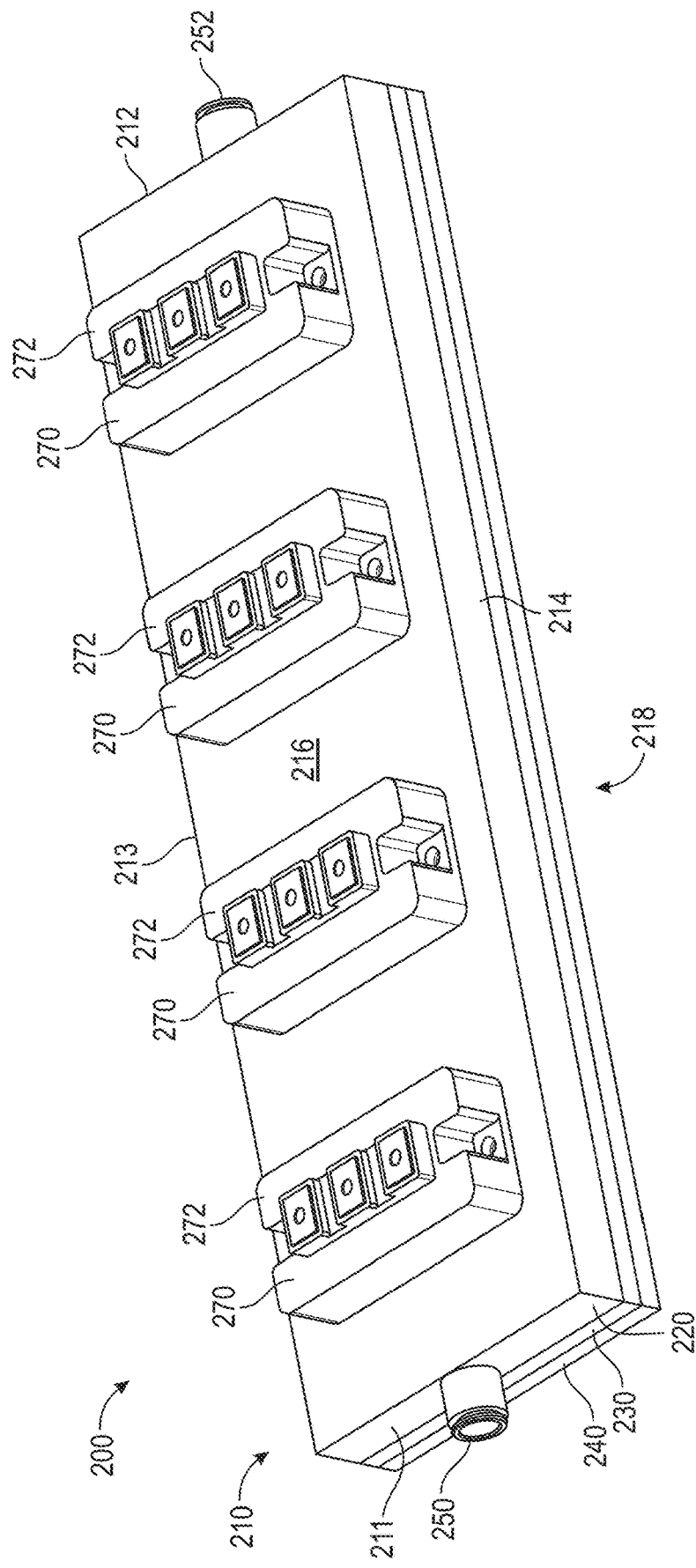
FIG. 2 illustrates a perspective view of an embodiment of heat extraction assembly/apparatus utilized by a power source, and in according with the present disclosure.

FIG. 2 illustrates a perspective view of an embodiment of a heat extraction assembly 200 that may be disposed within the power supply 110 illustrated in FIG. 1A and/or the power supply 166 illustrated in FIG. 1C in order to regulate the temperatures of components within the power supplies 110, 166. As illustrated, the heat extraction assembly 200 may include a cassette or cooling plate 210 and a number of components 270 (e.g., power modules, insulated-gate bipolar transistors (IGBT), bridges, diodes, snubber resistors, etc.) of the power supply 110, 166 coupled to the cassette 210. The cassette 210 illustrated includes a first end 211, an opposite second end 212, a first side 213 spanning from the first end 211 to the second end 212, and a second side 214 opposite the first side 213, the second side 214 also spanning from the first end 211 to the second end 212. The cassette 210 may further include a top side or top surface 216 and an opposite bottom side or bottom surface 218. As illustrated in FIG. 2, the components 270 are coupled to the top surface 216 of the cassette 210.

In the embodiment illustrated, and as explained in further detail below, the cassette 210 may be formed from three plates 220, 230, 240 that are coupled to one another. In other embodiments, the cassette 210 may be formed from a single plate or any other number of plates coupled to one another. The cassette 210 further includes an inlet 250 disposed at, or extending from, the first end 211 of the cassette 210. More specifically, the inlet 250 extends from the first or top plate 220 at the first end 211 of the cassette 210. The cassette 210 also includes an outlet 252 disposed at, or extending from, the second end 212 of the cassette 210. As illustrated, outlet 252 extends from the first or top plate 220 at the second end 212 of the cassette 210.

Figure 3:
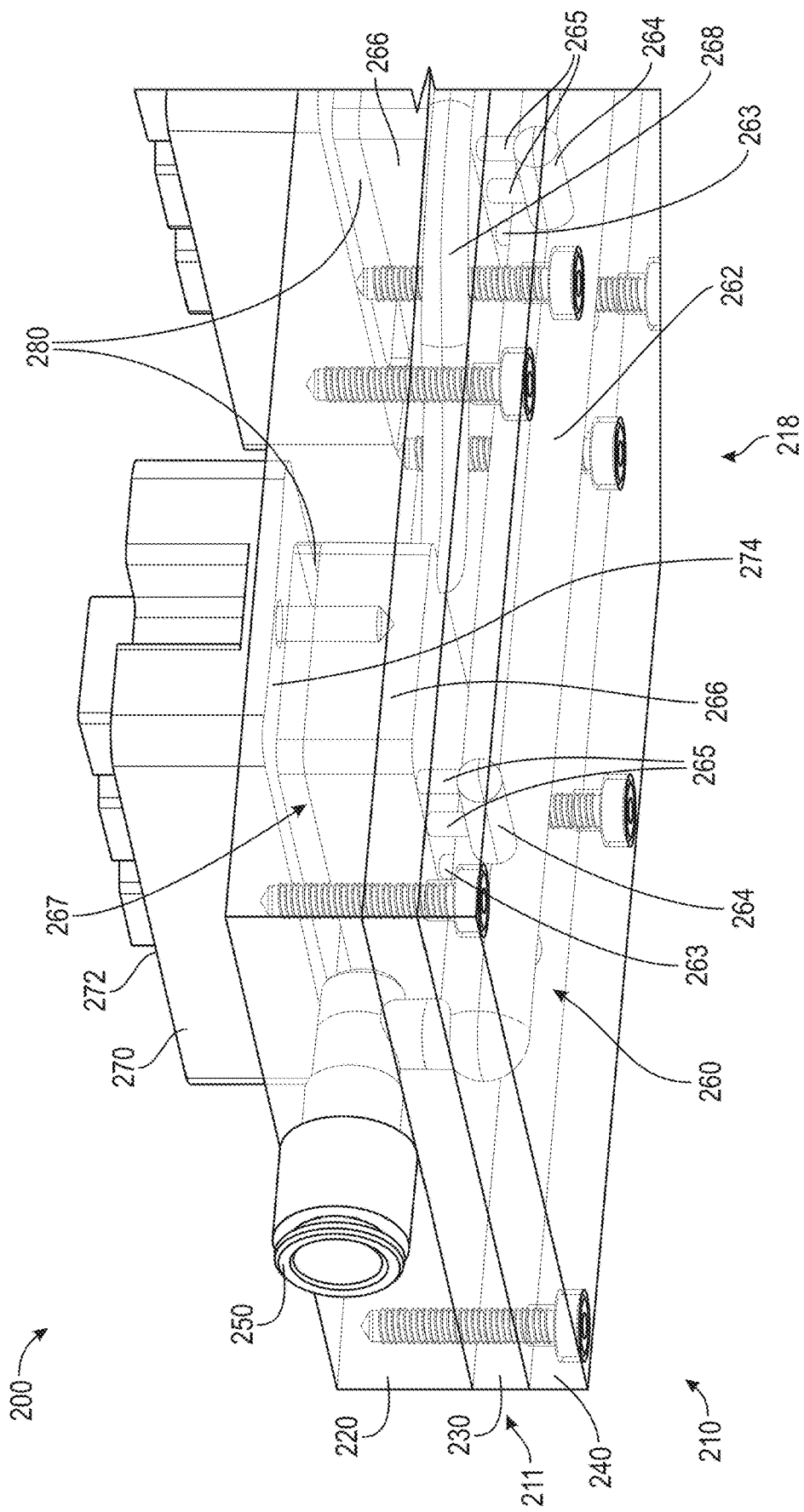
FIG. 3 illustrates a perspective view of a first end of the embodiment of the heat extraction assembly illustrated in FIG. 2, the cassette of the heat extraction assembly being shown in phantom to depict the coolant flow pathway and cooling cavities of the cassette.
Figure 4:
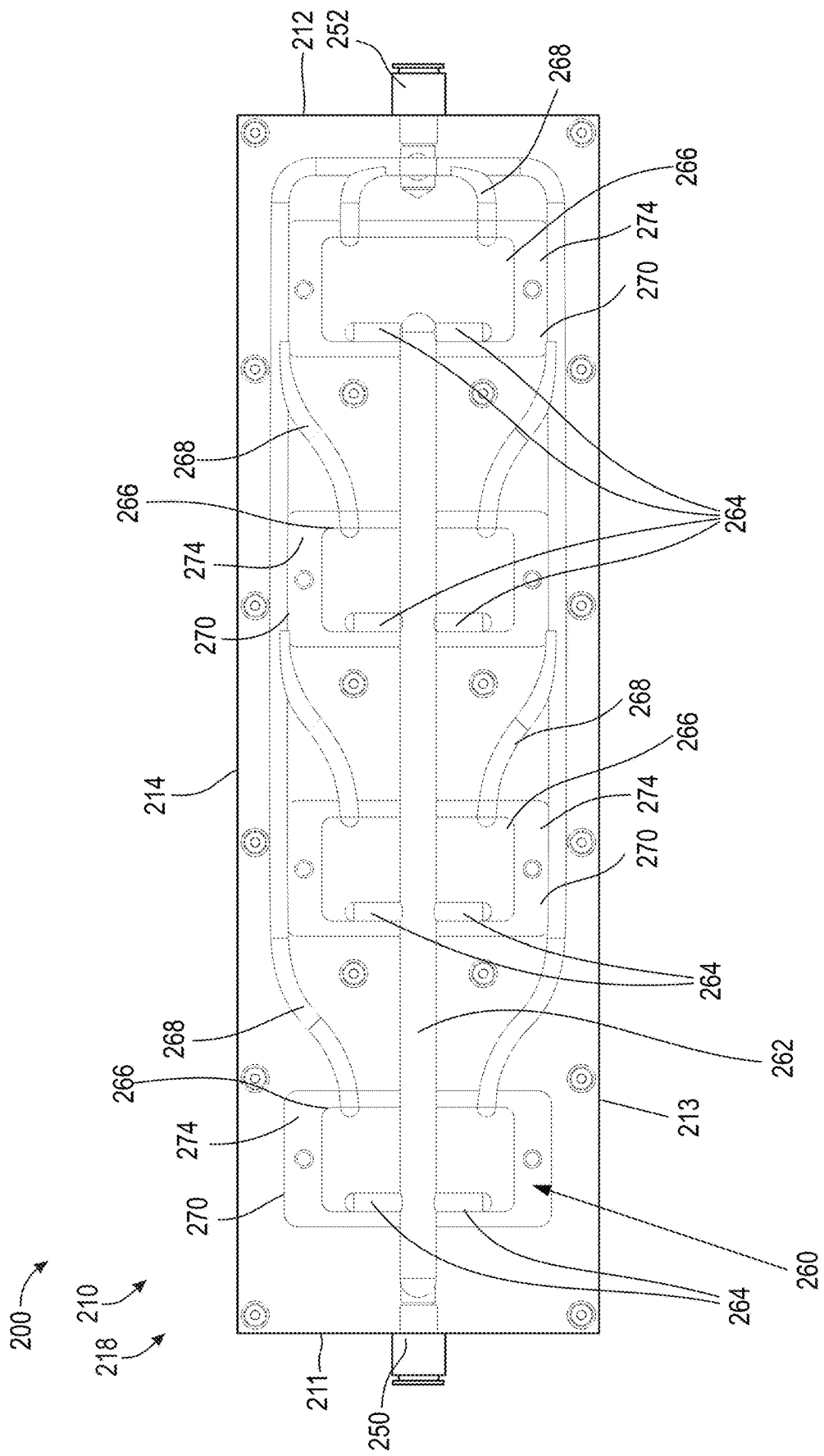
FIG. 4 illustrates a bottom view of the embodiment of the heat extraction assembly illustrated in FIG. 2, the cassette of the heat extraction assembly being shown in phantom to depict the coolant flow pathway and cooling cavities of the cassette.

Turning to FIGS. 3 and 4, disposed, at least partially, within the cassette 210 is a flow pathway 260 that is configured to receive a coolant, and configured to provide a cooling effect, or to regulate the temperature of, the components 270 that are coupled to the cassette 210. The flow pathway 260 may include a primary distribution channel 262, a plurality of secondary distribution channels 264, a plurality of cooling cavities 266, and a plurality of extraction channels 268. The inlet 250 and the outlet 252 may form the beginning and the end, respectively, of the flow pathway 260 through the cassette 210. Thus, coolant flowing through the cassette 210 may enter the flow pathway 260 at the inlet 250, flow through the flow pathway 260 (and the cassette 210), and exit the flow pathway 260 at the outlet 252.

The primary distribution channel 262 may span through the cassette 210 in a direction that generally extends from the first end 211 of the cassette 210 toward the second end 212 of the cassette 210. In addition, the primary distribution channel 262 may be centrally disposed within the cassette 210 between the first and second sides 213, 214 (i.e., the primary distribution channel 262 is located within the cassette 210 such that it is equidistant from the first and second sides 213, 214). As best illustrated in FIG. 3, the primary distribution channel 262 may be coupled to, or connected to, the inlet 250 such that coolant flowing through the inlet 250 flows directly into the primary distribution channel 262. As further illustrated in FIGS. 3, 5, and 6B, the primary distribution channel 262 may include a plurality of passages 263 along the length of the primary distribution channel 262. As explained in further detail below and illustrated in FIG. 3, each one of the plurality of passages 263 may align with a respective cooling cavity 266 such that coolant flowing through a passage 263 flows into that passage's respective cooling cavity 266.

Moreover, as best illustrated in FIG. 4, the flow pathway 260 includes a plurality of secondary distribution channels 264 that branch off of the primary distribution channel 262 at various locations along the primary distribution channel 262. The secondary distribution channels 264 may extend from, or branch off of, the primary distribution channel 262 proximate to a passage 263 of the primary distribution channel 264. In the illustrated embodiment, the secondary distribution channels 264 extend from the primary distribution channel 262 toward either the first side 213 or the second side 214 of the cassette 210. As further illustrated, a pair of secondary distribution channels 264 may extend from the primary distribution channel 262 at approximately the same location along the length of the primary distribution channel 262 (i.e., proximate to a passage 263 of the primary distribution channel 264), where one secondary distribution channel 264 of the pair of secondary distribution channels 264 may extend toward the first side 213 of the cassette 210 and the other secondary distribution channel 264 of the pair of secondary distribution channels 264 may extend toward the second side 214 of the cassette 210. The embodiment of the cassette 210 and the flow pathway 260 illustrated contains eight (8) secondary distribution channels 264, or four (4) pairs of secondary distribution channels 264, that branch off of the primary distribution channel 262. As further illustrated in FIGS. 3, 5, and 6B, each secondary distribution channel 264 may contain two passages 265 that extend vertically from the secondary distribution channel 264. The passages 265 of the secondary distribution channel 264 may align with a respective cooling cavity 266 such that coolant flowing through a passages 265 flow into that passages' respective cooling cavity 266. However, other embodiments of the cassette 210 and the flow pathway 260 may include any number of primary distribution channel(s) 262, any number of secondary distribution channels 264, and any number of passages 263, 265 (including any number of passages extending from the secondary distribution channels 264). Moreover, the primary distribution channel(s) 262 and secondary distribution channels 264 may extend through the cassette 210 in any direction in other embodiments of the cassette 210 and of the flow pathway 260.

Figure 5:
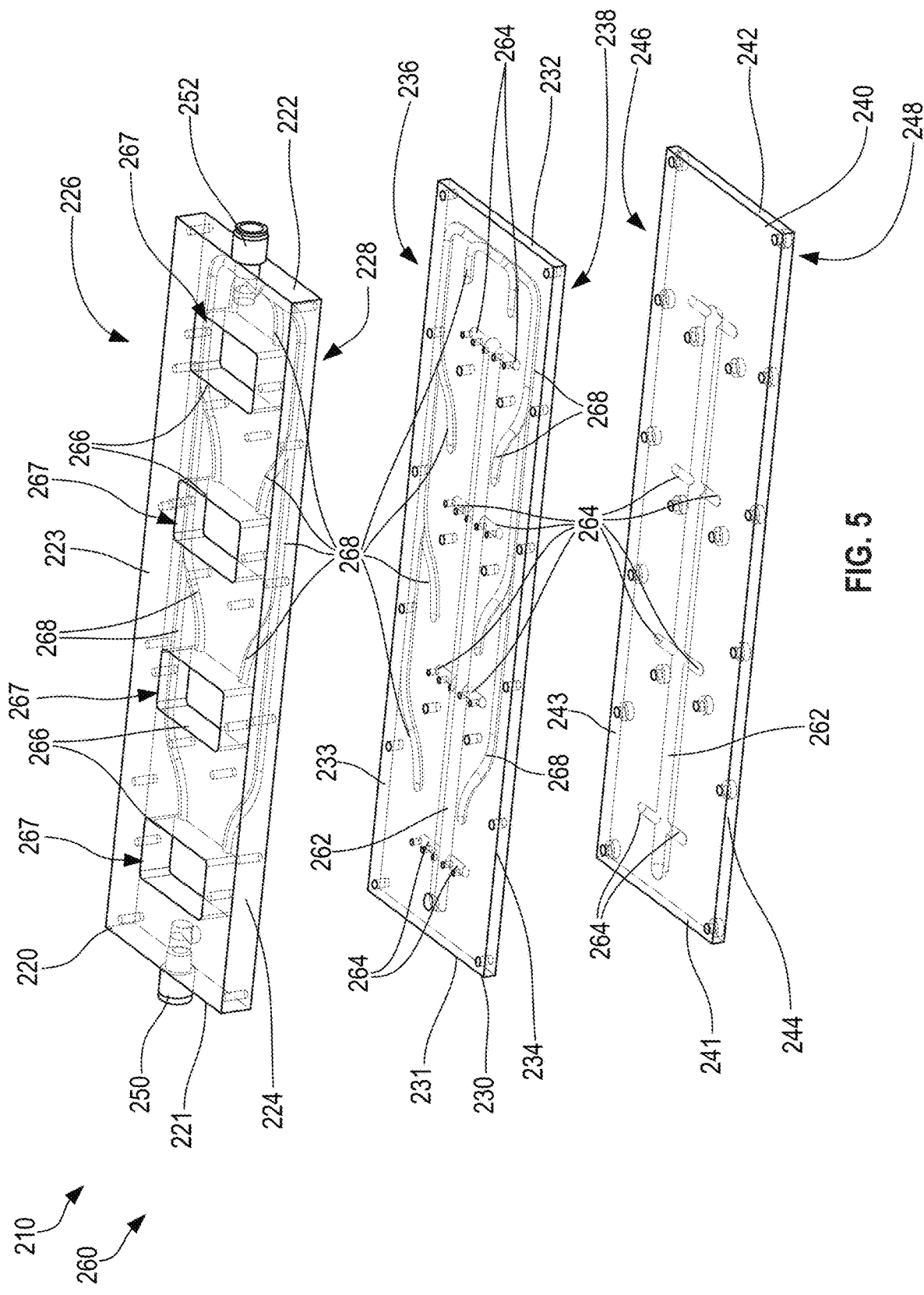
FIG. 5 illustrates an exploded view of the embodiment of the cassette of the heat extraction assembly illustrated in FIG. 2, and depicting the coolant flow pathway and cooling cavities.
Figure 6A:
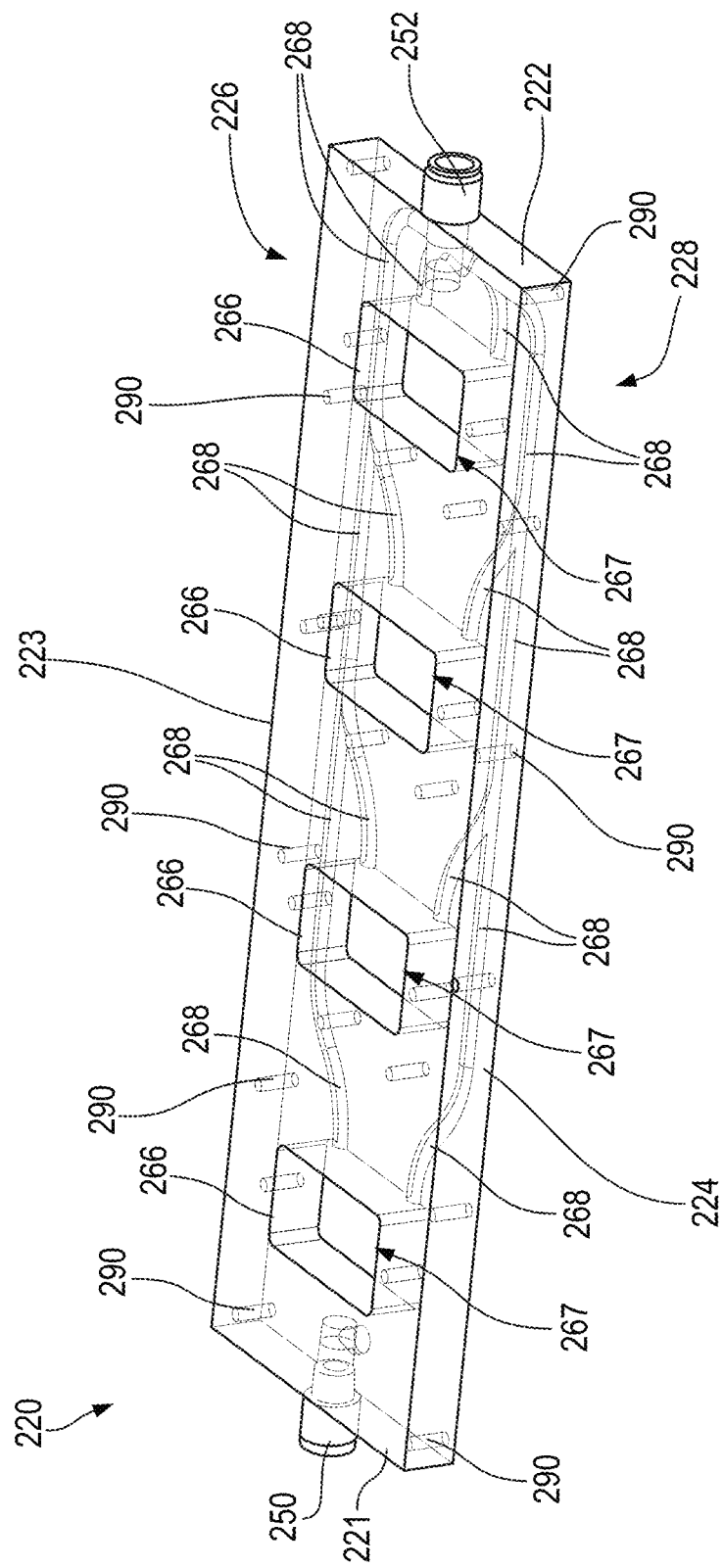
FIG. 6A illustrates a perspective view of the first or top cooling plate of the cassette of the heat extraction assembly illustrated in FIG. 2 and FIG. 5.

As previously explained, the flow pathway 260 includes a plurality of cooling cavities 266. In the embodiment illustrated, the flow pathway 260 includes four cooling cavities 266 that are equally spaced along the cassette 210 between the first end 211 and the second end 212. The cooling cavities 266 may also be disposed within the cassette 210 such that they are equidistant from the first side 213 and the second side 214 of the cassette 210. As illustrated in FIGS. 3, 5, and 6A, the cooling cavities 266 may be cavities, depressions, chambers, bays, etc. that are disposed within the top surface 216 of the cassette 210 such that at least a portion of the cooling cavities 266 is open to the area surrounding the cassette 210 (i.e., the cooling cavities 266, when a component is not coupled to the cassette 210, is exposed to the area surrounding the cassette 210). In other words, the top surface 216 of the cassette 210 may include an opening 267 that corresponds to each of the cooling cavities 266 disposed within the cassette 210. As further illustrated, the cooling cavities 266 may be disposed within the cassette 210 such that the cooling cavities 266 are disposed above the primary distribution channel 262 and the secondary distribution channels 264 (as well as above the passages 263, 265). In the illustrated embodiment, each pair of the secondary distribution channels 264 may be associated with a cooling cavity 266 such that, in addition to each passage 263 coupling a cooling cavity 266 to the primary distribution channel 262, the passages 265 of each pair of secondary distribution channels 264 also collectively couple a cooling cavity 266 to the primary distribution channel 262. Thus, the cooling cavities 266 may be in fluid communication with the primary distribution channel 262 and the secondary distribution channels 264 such that coolant flowing into the primary distribution channel 262 from the inlet 250 flows into each of the cooling cavities 266 via a respective passage 263 and the passages 265 of the respective secondary distribution channels 264. Other embodiments of the cassette 210 and the flow pathway 260 may include any number of cooling cavities 266 that may be located at any location within the cassette 210.

As further illustrated in FIGS. 3, 5, and 6A, the flow pathway 260 includes a plurality of extraction channels 268. In the illustrated embodiment, each cooling cavity 266 is coupled to, and in fluid communication with, two extraction channels 268. The extraction channels 268 of each of the cooling cavities 266 eventually converge with one another and are coupled to, and in fluid communication with, the outlet 252 of the cassette 210. The extraction channels 268 may extend from the cooling cavities 266 toward the first or second sides 213, 214 of the cassette 210, and toward the second end 212 of the cassette 210. Other embodiments of the cassette 210 and the flow pathway 260 may include any number of extraction channels 268, and any number of extraction channels 268 per cooling cavity 266, and the extraction channels 268 may be located at any location within the cassette 210.

As illustrated in FIGS. 2 and 3, the components 270 each contain at least a top surface 272 and an opposite bottom surface 274. As best illustrated in FIG. 3, each one of the components 270 is coupled to the top surface 216 of the cassette 210 proximate to a respective cooling cavity 266 such that the bottom surface 274 seals the opening 267 of the cooling cavity 266 in the top surface 216 of the cassette 210. In other words, when coupled to the cassette 210, the bottom surface 274 of the component 270 may form a boundary, or may define, at least a portion of the cooling cavity 266. In some embodiments, and as further illustrated in FIG. 3, a gasket or other type of seal 280 (e.g., O-ring, bellow seal, labyrinth seal, etc.) may be disposed between or around the bottom surface 274 of the component 270 and the top surface 216 of the cassette 210. The seal 280 may further be disposed around or engaged with the opening 267 of the cooling cavity 266. The seal 280 prevents the coolant flowing into and disposed within the cooling cavity 266 from leaking out of the cooling cavity 266 between the bottom surface 274 of the component 270 and the opening 267 of the cooling cavity 266. Thus, coolant flowing into and being disposed within the cooling cavity 266 may directly contact the bottom surface 274 of the component 270 without leaking out of the cooling cavity 266 and flow pathway 260.

The components 270 may be coupled to the top surface 216 of the cassette 210 via any know mechanical fasteners, other mechanical fastening means (e.g., clamping, stapling, embossed protrusions between plates, edge seams, hemming, rivets, pins, etc.), welding, bonding, adhesives, or any other conceivable coupling mechanism.

In other embodiments of the component 270, the bottom surface 274 of a component 270 may contain any number of extruded heat posts (either affixed, coupled, or formed integrally with the bottom surface 274 of the component 270) that, when the component 270 is coupled to the top surface 216 of the cassette 210 proximate to a cooling cavity 266, extend into the cooling cavity 266. Thus, the extended heat posts may increase the surface area of the component 270 that is in direct contact with the coolant flowing through the cooling cavity 266, which creates an increased temperature regulation/cooling effect for the component 270.

Continuing with FIGS. 3 and 4, and with further reference to FIGS. 5, 6A, 6B, 6C, and 7, the illustrated embodiment of the flow pathway 260 may promote a coolant to flow through the flow pathway 260 (and the cassette 210) from the inlet 250 to the outlet 252 to provide parallel cooling (i.e., simultaneously equal cooling) to each of the components 270. Once the coolant enters the flow pathway 260 through the inlet 250, the coolant may flow into the primary distribution channel 262 of the flow pathway 260. Portions of the flow of coolant may simultaneously flow out of the primary distribution channel 262 and into the various secondary distribution channels 264, while other portions may flow through the passages 263 of the primary distribution channel 262 and into the cooling cavities 266. The portions of the coolant flowing through the secondary distribution channels 264 may simultaneously flow into their respective cooling cavities 266 via passages 265 of the secondary distribution channels 264. As previously explained, the coolant disposed within, and flowing through, the cooling cavities 266 may directly contact the bottom surface 274 of the component 270 in order to provide a cooling effect to the component 270 (i.e., to regulate the temperature of the component 270) because the bottom surface 274 of each of the components 270 forms a boundary of its respective cooling cavity 266. After directly contacting the bottom surface 274 of the components 270, the coolant may simultaneously flow out of each of the cooling cavities 266 via the extraction channels 268, where the outflow of coolant from each of the cooling cavities 266 eventually merges together and flows out of the outlet 252. Thus, the embodiment of the flow pathway 260 illustrated in FIGS. 3, 4, 5, 6A, 6B, 6C, and 7 provides parallel cooling to multiple components 270 rather than cooling the components 270 in series. In other words, the flow pathway 260 allows for multiple components 270 to be cooled at the same rate and at the same time as one another because the temperature of the coolant entering each of the cooling cavities 266 and contacting the bottom surface 274 of the components 270 is equal to one another. In addition, the heating of the coolant by a component 270 at one cooling cavity 266 does not affect the temperature of the coolant at another cooling cavity 266, and, thus, does not adversely affect the cooling rate of another component 270. Not only does the flow pathway 260 illustrated herein promote the coolant flowing through each cooling cavity 266 being substantially equivalent to one another, as further illustrated in FIG. 7, the velocity of the coolant flowing through the cooling cavities 266 may also be substantially equivalent to one another. The velocity of the coolant flowing through each cooling cavity 266 may be substantially equivalent to one another despite the velocity of the coolant flowing through the primary distribution channel 262 varying slightly along the length of the primary distribution channel 262 (i.e., the velocity of the coolant being greater at the end of the primary distribution channel 262 located more proximate to the inlet 250 than the end of the primary distribution channel 262 located more proximate to the outlet 252). Conversely, conventional heat extraction assemblies that utilize liquid cooling methods are unable to provide a uniform rate of cooling for multiple components because the flow of coolant extracts the heat from each component sequentially along a flow pathway. Thus, the components at the end of the conventional coolant flow pathway are cooled at a slower rate than the components at the beginning of the conventional coolant flow pathway because the temperature of the coolant has already risen a significant amount from extracting heat from the components at the beginning of the cooling sequence. The parallel cooling flow pathway 260 illustrated in FIGS. 3, 4, 5, 6A, 6B, and 6C provides faster and more efficient cooling to multiple components than conventional serial cooling pathways.

Continuing with FIGS. 5, 6A, 6B, and 6C, and with continued reference to FIGS. 2, 3, and 4, the cassette 210 may be constructed from a series of cooling plates 220, 230, 240 that are affixed or coupled to one another. While FIGS. 5, 6A, 6B, and 6C illustrate three cooling plates 220, 230, 240 that make up the cassette 210, the cassette 210 may be constructed from any number of cooling plates, including being constructed from a single cooling plate. As further illustrated, and as explained in more detail below, the various portions of the flow pathway 260 may be machined or formed into the cooling plates 220, 230, 240 to create a multi-level cooling flow pathway 260.

As illustrated in FIGS. 5 and 6A, the first or top plate 220 may include a first end 221, an opposite second end 222, a first side 223 spanning between the first end 221 and the second end 222, and a second side 224 opposite the first side 223, the second side 224 also spanning between the first end 221 and the second end 222. The first plate 220 may further include a top side or top surface 226 and a bottom side or bottom surface 228. The top surface 226 of the first plate 220 may serve as the top surface 216 of the cassette 210. Thus, the components 270, when coupled to the top surface 216 of the cassette 210, are coupled to the top surface 226 of the first plate 220.

As previously explained, and as further illustrated in FIGS. 5 and 6A, the inlet 250 may be disposed within, and extend from, the first end 221 of the first plate 220, while the outlet 252 may be disposed within, and extend from, the second end 222 of the first plate 220. The cooling cavities 266 may be disposed within the first plate 220 and, as illustrated, may extend through the first plate 220 from the top surface 226 to the bottom surface 228 of the first plate 220. Disposed or formed within the bottom surface 228 of the first plate 220 may be a portion (i.e., top half) of the extraction channels 268.

Figure 6B:
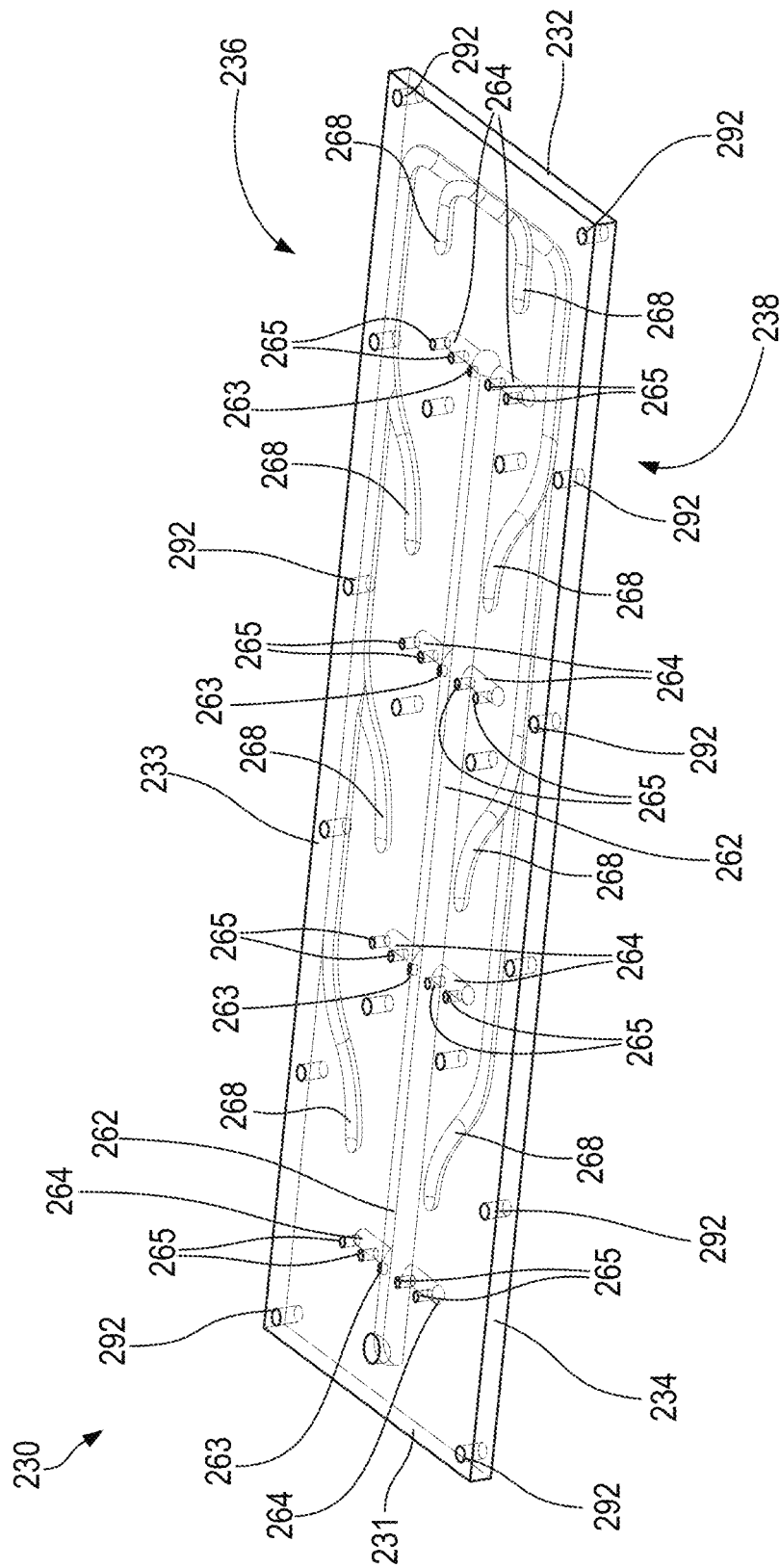
FIG. 6B illustrates a perspective view of the second or middle cooling plate of the cassette of the heat extraction assembly illustrated in FIG. 2 and FIG. 5.

As illustrated in FIGS. 5 and 6B, the second or middle plate 230 may include a first end 231, an opposite second end 232, a first side 233 spanning between the first end 231 and the second end 232, and a second side 234 opposite the first side 233, the second side 234 also spanning between the first end 231 and the second end 232. The second plate 230 may further include a top side or top surface 236 and a bottom side or bottom surface 238. The top surface 236 of the second plate 230 may be coupled to the bottom surface 228 of the first plate 220.

As further illustrated in FIGS. 5 and 6B, disposed or formed within the top surface 236 of the second plate 230 may be another portion (i.e., bottom half) of the extraction channels 268. The portion of the extraction channels 268 formed in the top surface 236 of the second plate 230 may be a mirror image, or complimentary, to the portion of the extraction channels 268 formed in the bottom surface 228 of the first plate 220 such that, when the first and second plates 220, 230 are coupled to one another, the two portions of the extraction channels 268 come together to form the full set of extraction channels 268. As further illustrated, a portion (i.e., top half) of the primary distribution channel 262 and the secondary distribution channels 264 may be disposed or formed in the bottom surface 238 of the second plate 230. The passages 263 of the primary distribution channel 262 and the passages 265 of the secondary distribution channels 264 may extend through the second plate 230 to the top surface 236 of the second plate 230 at locations that correspond with the cooling cavities 266 disposed in the first plate 220 when the first and second plates 220, 230 are coupled to one another.

Figure 6C:
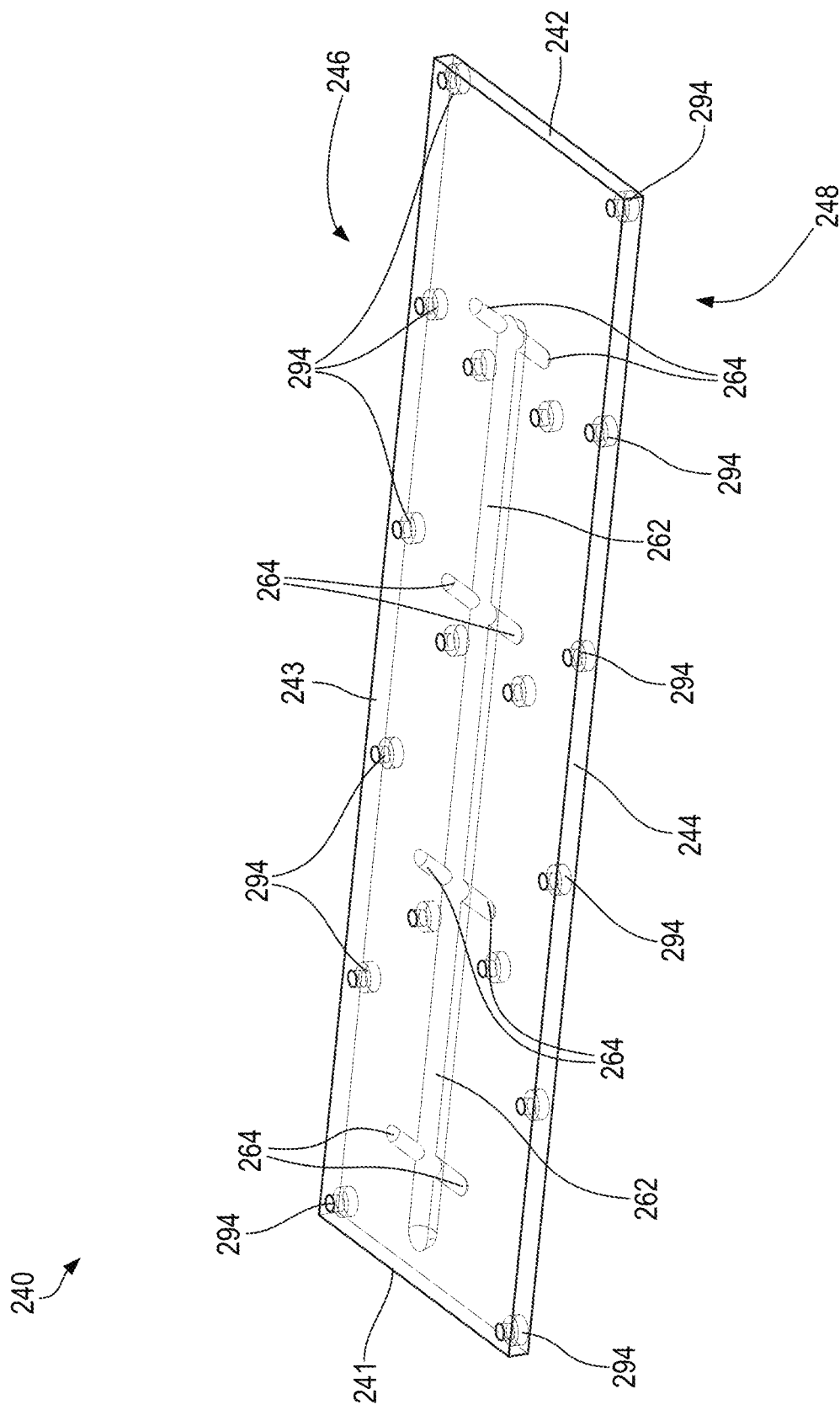
FIG. 6C illustrates a perspective view of the third or bottom cooling plate of the cassette of the heat extraction assembly illustrated in FIG. 2 and FIG. 5.
Figure 7:
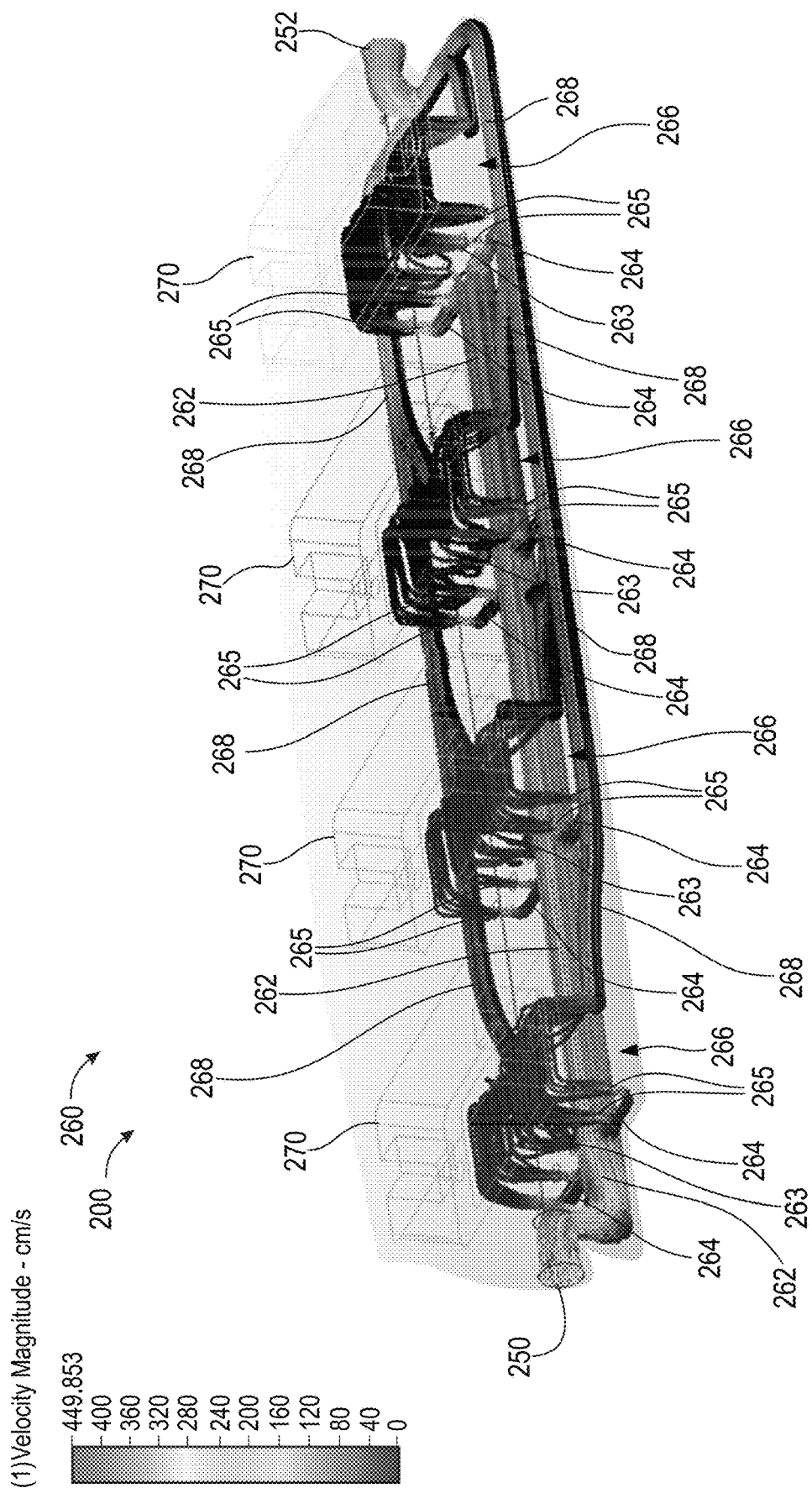
FIG. 7 illustrates a flow diagram of coolant flowing through the flow pathway of the heat extraction assembly illustrated in FIG. 2 and FIG. 5.

As illustrated in FIGS. 5 and 6C, the third or bottom plate 240 may include a first end 241, an opposite second end 242, a first side 243 spanning between the first end 241 and the second end 242, and a second side 244 opposite the first side 243, the second side 244 also spanning between the first end 241 and the second end 242. The third plate 240 may further include a top side or top surface 246 and a bottom side or bottom surface 248. The top surface 246 of the third plate 240 may be coupled to the bottom surface 238 of the second plate 230. The bottom surface 248 of the third plate 240 may serve as the bottom surface 218 of the cassette 210.

As further illustrated in FIGS. 5 and 6C, disposed or formed within the top surface 246 of the third plate 240 may be another portion (i.e., bottom half) of the primary distribution channel 262 and the secondary distribution channels 264. The portion of the distribution channels 262, 264 formed in the top surface 246 of the third plate 240 may be complimentary to the portions of the distribution channels 262, 264 formed in the bottom surface 238 of the second plate 230 such that, when the second and third plates 230, 240 are coupled to one another, the two portions of each of the distribution channels 262, 264 come together to form the full set of distribution channels 262, 264.

As further illustrated in FIGS. 5, 6A, 6B, and 6C, the each of the plates 220, 230, 240 of the cassette 210 contains one or more fastener openings 290, 292, 294. More specifically, the first plate 220 contains fastener openings 290 that extend into the first plate 220 from the bottom surface 228. The second plate 230 contains fastener openings 292 that extend through the second plate 230 from the bottom surface 238 to the top surface 236. The third plate 240 contains fastener openings 294 that extend through the third plate 240 from the bottom surface 248 to the top surface 246. As further illustrated, the fastener openings 294 of the third plate 240 are shaped to receive the shank and head of a mechanical fastener (e.g., screw, bolt, nail, etc.). The fastener openings 290, 292, 294 of the plates 220, 230, 240 may be substantially aligned with one another when the first plate 220, second plate 230, and third plate 240 are stacked on top of one another. A mechanical fastener (e.g., screw, bolt, nail, etc.) may interact with each fastener opening 290, 292, 294 that are aligned together to secure the plates 220, 230, 240 to one another. In other embodiments, the plates 220, 230, 240 may be secured, coupled, or affixed to one another via other mechanical means (e.g., clamping, stapling, embossed protrusions between plates, edge seams, hemming, rivets, pins, etc.), welding bonding, adhesives, or any other conceivable coupling mechanisms. While not illustrated, a seal (e.g., gasket, O-ring, bellow seal, labyrinth seal, etc.) may be disposed between each of the plates 220, 230, 240 when coupled to one another in order to prevent leaking of the coolant from the flow pathway 260 and between the plates 220, 230, 240.

Figure 8:
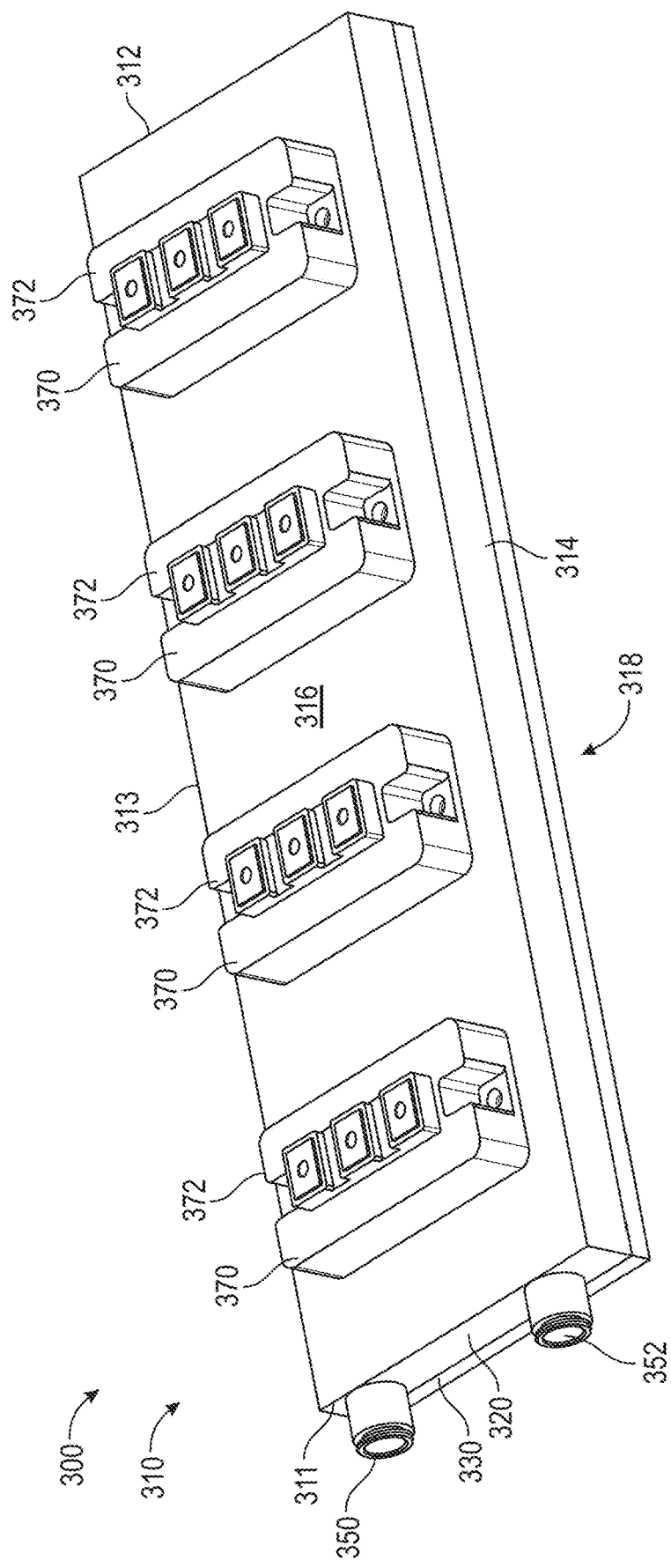
FIG. 8 illustrates a perspective view of another embodiment of a heat extraction assembly/apparatus utilized by a power source, and in according with the present disclosure.
Figure 9:
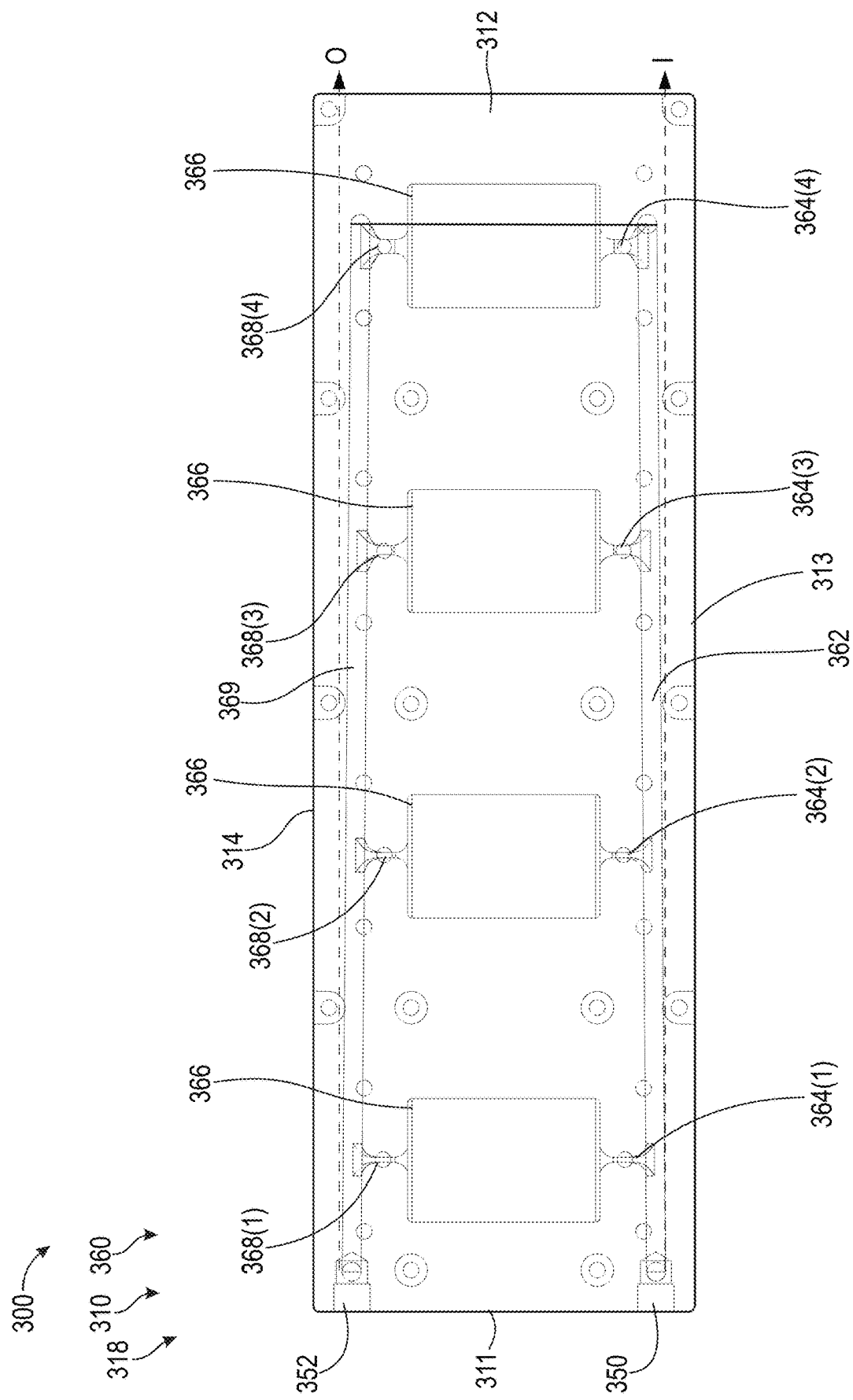
FIG. 9 illustrates a bottom view the heat extraction assembly illustrated in FIG. 8, the cassette of the heat extraction assembly being shown in phantom to depict another embodiment of a coolant flow pathway and cooling cavities of the cassette.
Figure 10:
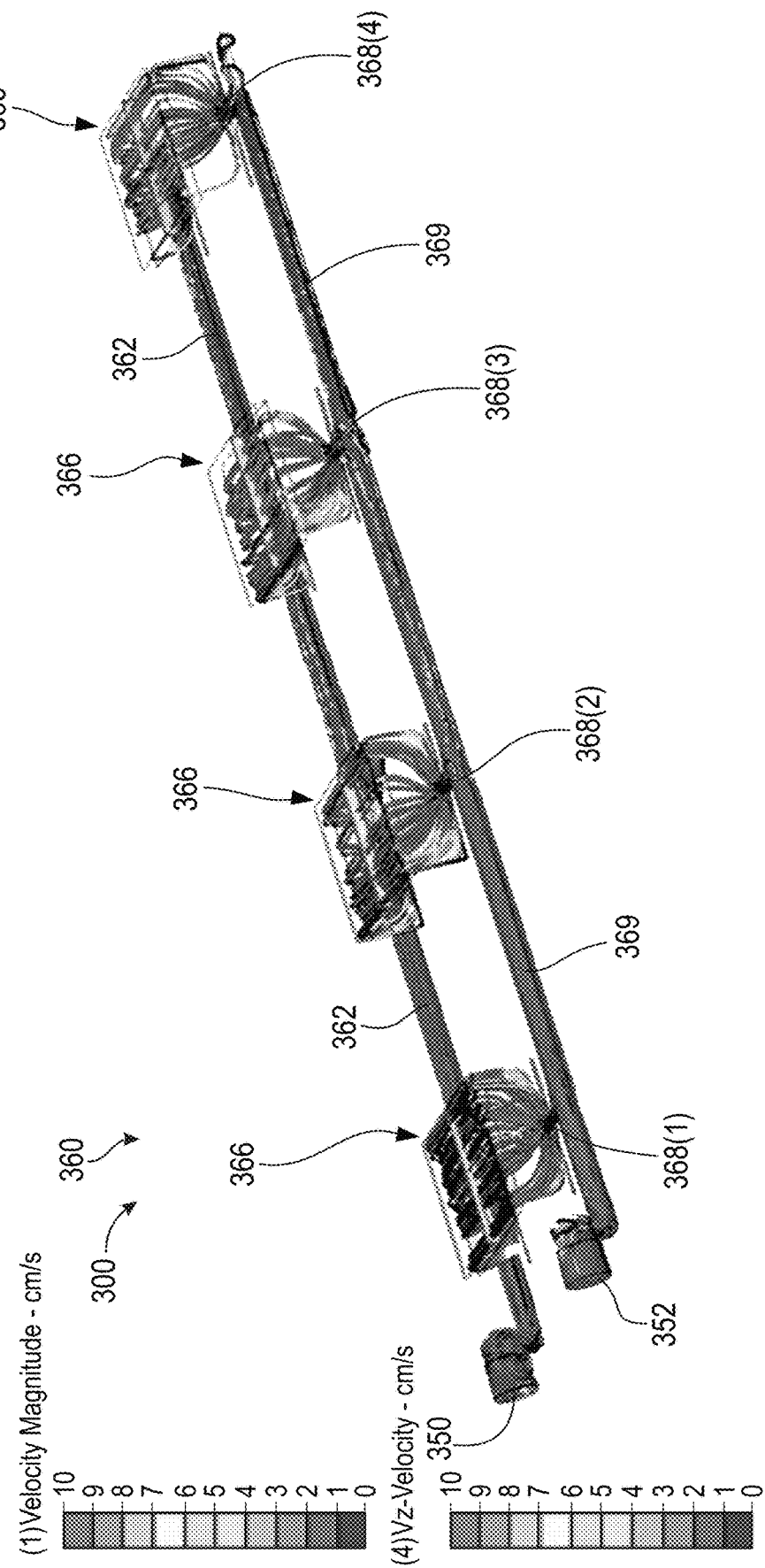
FIG. 10 illustrates a flow diagram of coolant flowing through the flow pathway of the heat extraction assembly illustrated in FIGS. 8 and 9.

Turning to FIGS. 8-10, illustrated is another example embodiment of a heat extraction assembly 300, with another example embodiment of a flow pathway 360 disposed within a cassette 310 of a heat extraction assembly 300. More specifically, FIG. 8 illustrates a perspective view of another embodiment of a heat extraction assembly 300 that may be disposed within the power supply 110 illustrated in FIG. 1A and/or the power supply 166 illustrated in FIG. 1C in order to regulate the temperatures of components within the power supplies 110, 166. As illustrated, the heat extraction assembly 300 may include a cassette or cooling plate 310 and a number of components 370 (e.g., power modules, insulated-gate bipolar transistors (IGBT), bridges, diodes, snubber resistors, etc.) of the power supply 110, 166 coupled to the cassette 310. Like the cassette 210, the cassette 310 illustrated includes a first end 311, an opposite second end 312, a first side 313 spanning from the first end 311 to the second end 312, and a second side 314 opposite the first side 313, the second side 314 also spanning from the first end 311 to the second end 312. The cassette 310 may further include a top side or top surface 316 and an opposite bottom side or bottom surface 318. The components 370, as illustrated, may be coupled to the top surface 316 of the cassette 310. Each of the components 370 may include a top surface 372 and an opposite bottom surface 374 (not illustrated), where the bottom surface 374 of each component 370 faces, or is in abutment with, the top surface 316 of the cassette 310 when the components 370 are coupled to the cassette 310.

In the embodiment illustrated, the cassette 310 may be formed from two plates 320, 330 that are coupled to one another in accordance with the coupling mechanism described above. Moreover, unlike the cassette 210, the cassette 310 further includes an inlet 350 and outlet 352 disposed at, or extending from, the first end 311 of the cassette 310. More specifically, the inlet 350 and the outlet 352 extend from the first or top plate 320 at the first end 311 of the cassette 310.

Turning to FIG. 9, disposed, at least partially, within the cassette 310 is a flow pathway 360 that is configured to receive a coolant, and configured to provide a cooling effect, or to regulate the temperature of, the components 370 that are coupled to the cassette 310. The flow pathway 360 may include a primary distribution channel 362, a plurality of distribution passages 364(1)-364(4), a plurality of cooling cavities 366, a plurality of extraction passages 368(1)-368(4), and a primary extraction channel 369. The inlet 350 and the outlet 352 may form the beginning and the end, respectively, of the flow pathway 360 through the cassette 310. Thus, coolant flowing through the cassette 310 may enter the flow pathway 360 at the inlet 350, flow through the flow pathway 360 (and the cassette 310), and exit the flow pathway 360 at the outlet 352.

As illustrated in FIG. 9, the primary distribution channel 362 may be disposed within the cassette 310 such that the primary distribution channel 362 is disposed more proximate to the first side 313 of the cassette 310 than the second side 314 of the cassette 310. The primary distribution channel 362 may span from the inlet 350 proximate to the first end 311 toward the second end 312 of the cassette 310. As further illustrated, the primary distribution channel 362 may extend through the cassette 310 such that the primary distribution channel 362 is offset from axis I, which is parallel to the first and second sides 313, 314 of the cassette 310. Thus, the primary distribution channel 362 extends through the cassette 310 such that the primary distribution channel 362 is offset from being parallel to the first and second sides 313, 314. Extending from the primary distribution channel 362 toward the second side 314 of the cassette 310, and positioned at various locations along the length of the primary distribution channel 362, are a plurality distribution passages 364(1)-364(4). Each of the distribution passages 364(1)-364(4) may be substantially hourglass shaped. In addition, each of the distribution passages 364(1)-364(4) also differ in width, with the fourth distribution passage 364(4), which is disposed farthest from the inlet 350, being greater in width than the first distribution passage 364(1), which is disposed closest to the inlet 350. As further illustrated in FIG. 9, each of the distribution passages 364(1)-364(4) aligns with a respective cooling cavity 366.

As previously explained, the flow pathway 360 includes a plurality of cooling cavities 366. In the embodiment illustrated in FIG. 9, the flow pathway 360 includes four cooling cavities 366 that are equally spaced along the cassette 310 between the first end 311 and the second end 312. The cooling cavities 366 may also be disposed within the cassette 310 such that they are equidistant from the first side 313 and the second side 314 of the cassette 310. Like the cooling cavities 266 of the first embodiment, the cooling cavities 366 of the second embodiment may be cavities, depressions, chambers, bays, etc. that are disposed within the top surface 316 of the cassette 310 such that at least a portion of each of the cooling cavities 366 is open to the area surrounding the cassette 310 (i.e., the cooling cavities 366, when a component is not coupled to the cassette 310, is exposed to the area surrounding the cassette 310). In other words, like the cassette 210, the top surface 316 of the cassette 310 may include an opening (not shown) that corresponds to each of the cooling cavities 366 disposed within the cassette 310. As illustrated in FIG. 9, each distribution passage 364(1)-364(4) may be associated with a cooling cavity 366 such that a distribution passage 364(1)-364(4) couples a cooling cavity 366 to the primary distribution channel 362. Thus, the cooling cavities 366 may be in fluid communication with the primary distribution channel 362 and the secondary distribution channels 364(1)-364(4) such that coolant flowing into the primary distribution channel 362 from the inlet 350 flows into each of the cooling cavities 366 via their respective secondary distribution channels 364(1)-364(4).

As illustrated in FIG. 9, the flow pathway 360 also includes a plurality of extraction passages 368(1)-368(4) and a primary extraction channel 369. The primary extraction channel 369 may be disposed within the cassette 310 such that the primary extraction channel 369 is disposed more proximate to the second side 314 of the cassette 310 than the first side 313 of the cassette 310. The primary extraction channel 369 may span from the outlet 352 proximate to the first end 311 toward the second end 312 of the cassette 310. As further illustrated, the primary extraction channel 369 may extend through the cassette 310 such that the primary extraction channel 369 is offset from axis O, which is parallel to the first and second sides 313, 314. Thus, the primary extraction channel 369 extends through the cassette 310 such that the primary extraction channel 369 is offset from being parallel to the first and second sides 313, 314 while also being offset from being parallel to the primary distribution channel 362. As illustrated in FIG. 9, the primary distribution channel 362 and the primary extraction channel 369 extend through the cassette 310 at angles such that the two channels 362, 369 at least partially converge toward one another (i.e., the ends of the two channels 362, 369 disposed most proximate to the second end 312 of the cassette 310 are disposed closer to one another than the ends of the two channels 362, 369 that are coupled to the inlet 350 and outlet 352, respectively). Extending from the primary extraction channel 369 toward the first side 313 of the cassette 310, and positioned at various locations along the length of the primary extraction channel 369, are the plurality of extraction passages 368(1)-368(4). Similar to the plurality of distribution passages 364(1)-364(4), each of the extraction passages 368(1)-368(4) may be substantially hourglass shaped. In addition, also like the plurality of distribution passages 364(1)-364(4), each of the extraction passages 368(1)-368(4) differ in width, with the fourth extraction passage 368(4), which is disposed farthest from the outlet 352, being greater in width than the first extraction passage 368(1), which is disposed closest to the outlet 352. As further illustrated in FIG. 9, each of the distribution passages 368(1)-368(4) aligns with, and is fluid communication with, a respective cooling cavity 366. The plurality of extraction passages 368(1)-368(4) may be coupled to their respective cooling cavities 366 on the sides of the cooling cavities 366 that are opposite of the sides to which the plurality of distribution passages 364(1)-364(4) are coupled.

Continuing with FIGS. 8-10, the illustrated embodiment of the flow pathway 360 may promote a coolant to flow through the flow pathway 360 (and the cassette 310) from the inlet 350 to the outlet 352 in order to provide parallel cooling (i.e., simultaneously equal cooling) to each of the components 370. Once the coolant enters the flow pathway 360 through the inlet 350, the coolant may flow into the primary distribution channel 362 of the flow pathway 360. Portions of the flow of coolant may simultaneously flow out of the primary distribution channel 362 and into the plurality of distribution passages 364(1)-364(4). The portions of the coolant flowing through the plurality of distribution passages 364(1)-364(4) may simultaneously flow into their respective cooling cavities 366. As previously explained, each of the widths/sizes of the plurality of distribution passages 364(1)-364(4) may progressively vary along the length of the primary distribution channel 362 (the thinnest distribution passage being the first distribution passage 364(1); the widest distribution passage being the fourth distribution passage 364(4); the second distribution passage 364(2) being wider than the first distribution passage 364(1) but thinner than the fourth distribution passage 364(4); and the third distribution passage 364(3) being wider than both the first and second distribution passages 364(1), 364(2), but thinner than the fourth distribution passage 364(4)). Because the plurality of distribution passages 364(1)-364(4) are progressively disposed along the length of the primary distribution channel 362 (i.e., coolant reaches the first distribution passage 364(1) prior to distribution passages 364(2)-364(4), coolant reaches the second distribution passage 364(2) prior to distribution passages 364(3)-364(4), etc.), the varying widths/sizes of the plurality of distribution passages 364(1)-364(4) promote substantially equivalent flowrates and volumes of coolant into each respective cooling cavity 366.

Moreover, as previously explained, the coolant disposed within, and flowing through, the cooling cavities 366 may directly contact the bottom surface 374 of the component 370 in order to provide a cooling effect to the component 370 (i.e., to regulate the temperature of the component 370) because the bottom surface 374 of each of the components 370 forms a boundary of its respective cooling cavity 366. After directly contacting the bottom surface 374 of the components 370, the coolant may simultaneously flow out of each of the cooling cavities 366 via the plurality of extraction passages 368(1)-368(4). Like the plurality of distribution passages 364(1)-364(4), each of the widths/sizes of the plurality of extraction passages 368(1)-368(4) may progressively vary along the length of the primary extraction channel 369 (the thinnest extraction passage being the first extraction passage 368(1); the widest extraction passage being the fourth extraction passage 368(4); the second extraction passage 368(2) being wider than the first extraction passage 368(1) but thinner than the fourth extraction passage 368(4); and the third extraction passage 368(3) being wider than both the first and second extraction passages 368(1), 368(2), but thinner than the fourth extraction passage 368(4)). Because the plurality of extraction passages 368(1)-368(4) are progressively disposed along the length of the primary extraction channel 369 (i.e., the first extraction passage 368(1) is disposed closest to the outlet 352 than extraction passages 368(2)-368(4), the second extraction passage 368(2) being disposed closer to the outlet 352 than extraction passages 368(3)-368(4), etc.), the varying widths/sizes of the plurality of extraction passages 368(1)-368(4) promote substantially equivalent flowrates and volumes of coolant out of each respective cooling cavity 366. As best illustrated in FIG. 10, the outflow of coolant from each of the cooling cavities 366 eventually merges together in the primary extraction channel 369 and flows out of the outlet 352.

The embodiment of the flow pathway 360 illustrated in FIGS. 8-10 provides parallel cooling to multiple components 370 rather than cooling the components 370 in series. In other words, the flow pathway 360 allows for multiple components 370 to be cooled at the same rate and at the same time as one another because the temperature of the coolant entering each of the cooling cavities 366 and contacting the bottom surface 374 of the components 370 is equal to one another. In addition, the heating of the coolant by a component 370 at one cooling cavity 366 does not affect the temperature of the coolant at another cooling cavity 366, and, thus, does not adversely affect the cooling rate of another component 370. Not only does the flow pathway 360 illustrated in FIGS. 9 and 10 promote the temperature of coolant flowing through each cooling cavity 366 being substantially equivalent to one another, but, as further illustrated in FIG. 10, the velocity of the coolant flowing through the cooling cavities 366 may also be substantially equivalent to one another. The velocity of the coolant flowing through each cooling cavity 366 may be substantially equivalent to one another despite the velocity of the coolant flowing through the primary distribution channel 362 and the primary extraction channel 369 varying slightly along the length of the channels 362, 369 (i.e., the velocity of the coolant being greater at the end of the primary distribution channel 362 located more proximate to the inlet 350 and the first end 311 of the cassette 310 than the end of the primary distribution channel 362 located more proximate to the second end 312 of the cassette 310; the velocity of the coolant being greater at the end of the primary extraction channel 369 located more proximate to the outlet 352 and the first end 311 of the cassette 310 than the end of the primary extraction channel 369 located more proximate to the second end 312 of the cassette 310). This substantially equivalent velocity through the cooling cavities 366 may at least be enabled by the varying widths of plurality of distribution passages 364(1)-364(4) and the varying widths of the plurality of extraction passages 368(1)-368(4). Conversely, conventional heat extraction assemblies that utilize liquid cooling methods are unable to provide a uniform rate of cooling for multiple components because the flow of coolant extracts the heat from each component sequentially along a flow pathway. Thus, the components at the end of the conventional coolant flow pathway are cooled at a slower rate than the components at the beginning of the conventional coolant flow pathway because the temperature of the coolant has already risen a significant amount from extracting heat from the components at the beginning of the cooling sequence. The parallel cooling flow pathway 360 illustrated in FIGS. 8-10 provides faster and more efficient cooling to multiple components than conventional serial cooling pathways.

The heat extraction assemblies 200, 300 described above may be configured to provide direct liquid cooling of components 270, 370, respectively, of a power supply 110, 166. Because the coolant flowing through the flow pathways 260, 360 directly contacts the bottom surfaces 274, 374 of the components 270, 370 coupled to the cassettes 210, 310, the cassettes 210, 310 themselves, including the plates 220, 230, 240, 320, 330 may be constructed from materials that are not typically used, or are not capable of being used, to conduct heat. Thus, the cassettes 210, 310 may be constructed from other unconventional materials that may reduce manufacturing and material costs, while also reducing the overall weight of the power supply 110, 166.

The heat extraction assemblies 200, 300 and associated flow pathways 260, 360 described above may control their cooling capacities by regulating the flow rate of the coolant through the flow pathways 260, 360. For example, the heat extraction assemblies 200, 300 may promote an increase in cooling capacity or capability, if warranted, by increasing the coolant flow rate through the flow pathways 260, 360. The adjustment of the coolant flow rate (and subsequently adjustment of the cooling capacity) may be achieved via an automated fashion or process (e.g., when more current is demanded from power supply the flow rate is automatically increased by the system). In other embodiments, the coolant flow rate may be adjusted, as needed, either by the end user, or set statically if it's determined to be necessary during a more advanced development stage.

The cooling capacity of the heat extraction assemblies 200, 300 and associated flow pathways 260, 360 described above may also be controlled by adjusting the number of inlets and/or adjusting the cross-sectional area/profile of the inlets for a given cooling cavity. Adjusting the number and/or size of the inlets to a cooling cavity subsequently adjusts the flow of the coolant into, and through, the cooling cavities. In addition, the backpressure in the flow pathways 260, 360 may also be adjusted by varying the number, size, and profiles of the outlets from each respective cooling cavity. For example, if the component located furthest upstream from the inlet of a flow pathway 260, 360 needs additional cooling, one could increase the cumulative inlet/outlet area for the respective cooling cavity while also reducing the inlet/outlet area of the neighboring cooling cavities accordingly. As shown in the flow pathway 360 illustrated in FIGS. 9 and 10, the size and profile of each of the plurality of distribution passages 364(1)-364(4) and of the plurality of extraction passages 368(1)-368(4) are optimized to maintain equal flow and velocity across all of the cooling cavities 366. The cooling capacity of the heat extraction assemblies 200, 300 and associated flow pathways 260, 360 described above may also be controlled by adjusting the angular orientation of the primary channels. For example, as shown in the flow pathway 360 illustrated in FIGS. 9 and 10, the primary distribution channel 362 and the primary extraction channel 369 are angled from being parallel to each other and from being parallel to the first and second sides 313, 314 of the cassette 310 in order to prevent air bubbles from accumulating in the flow pathway 360 both during operation and at rest. This may also facilitate the ability to conveniently and completely drain the coolant from the flow pathway 360 and the cassette 310 when the power supply 110, 166 needs to be serviced.

In addition, the heat extraction assemblies 200, 300 described above eliminate the thermal resistances and associated analysis complications that are created by the use of thermal grease to affix components of a power supply to conventional heat extraction assemblies because the heat extraction assemblies 200, 300 do not require or utilize thermal grease. Furthermore, the heat extraction assemblies 200, 300 described above reduce the possibility of assembly variations for affixing components of a power supply to a conventional heat extraction assembly because the precise flatness tolerances for mounting planes of heat sinks or cold plates, as well the precise flatness tolerances for the components affixed to a conventional heat extraction assembly, are eliminated.

While the apparatuses presented herein have been illustrated and described in detail and with reference to specific embodiments thereof, it is nevertheless not intended to be limited to the details shown, since it will be apparent that various modifications and structural changes may be made therein without departing from the scope of the inventions and within the scope and range of equivalents of the claims. For example, the flow pathway presented herein may be modified to contain any number of channels, cavities, inlets, and outlets, the components presented herein of the power supply coupled to the heat extraction assembly may be any component, device, or module of a power supply that generates heat and/or requires temperature regulation, the cassette of the heat extraction assembly presented herein may include any number of plates and plates of any shape and size.

In addition, various features from one of the embodiments may be incorporated into another of the embodiments. That is, it is believed that the disclosure set forth above encompasses multiple distinct inventions with independent utility. While each of these inventions has been disclosed in a preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions, and/or properties disclosed herein. Accordingly, it is appropriate that the appended claims be construed broadly and in a manner consistent with the scope of the disclosure as set forth in the following claims.

It is also to be understood that terms such as "left," "right," "top," "bottom," "front," "rear," "side," "height," "length," "width," "upper," "lower," "interior," "exterior," "inner," "outer" and the like as may be used herein, merely describe points of reference and do not limit the present invention to any particular orientation or configuration. Further, the term "exemplary" is used herein to describe an example or illustration. Any embodiment described herein as exemplary is not to be construed as a preferred or advantageous embodiment, but rather as one example or illustration of a possible embodiment of the invention. Additionally, it is also to be understood that the components of the apparatuses described herein, the heat extraction assembly described herein, or portions thereof may be fabricated from any suitable material or combination of materials, such as, but not limited to, plastic or metals (e.g., copper, bronze, aluminum, steel, etc.), as well as derivatives thereof, and combinations thereof. In addition, it is further to be understood that the steps of the methods described herein may be performed in any order or in any suitable manner.

Finally, when used herein, the term "comprises" and its derivations (such as "comprising", etc.) should not be understood in an excluding sense, that is, these terms should not be interpreted as excluding the possibility that what is described and defined may include further elements, steps, etc. Similarly, where any description recites "a" or "a first" element or the equivalent thereof, such disclosure should be understood to include incorporation of one or more such elements, neither requiring nor excluding two or more such elements. Meanwhile, when used herein, the term "approximately" and terms of its family (such as "approximate", etc.) should be understood as indicating values very near to those which accompany the aforementioned term. That is to say, a deviation within reasonable limits from an exact value should be accepted, because a skilled person in the art will understand that such a deviation from the values indicated is inevitable due to measurement inaccuracies, etc. The same applies to the terms "about", "around", "generally", and "substantially."

What is claimed is:

1. A power supply for a welding or cutting system, the power supply comprising:
    a cooling cassette including:
        an inlet,
        an outlet,
        a cooling cavity disposed within a top surface of the cooling cassette, the cooling cavity being in fluid communication with the inlet and the outlet,
        a primary distribution channel configured to receive coolant from the inlet and direct coolant toward the cooling cavity,
        a secondary distribution channel fluidly coupled to the cooling cavity and to the primary distribution channel to direct coolant from the primary distribution channel into the cooling cavity,
        an extraction channel fluidly coupled to the cooling cavity to direct coolant out of the cooling cavity,
        a first plate including the cooling cavity, a portion of the extraction channel, the inlet, and the outlet,
        a second plate including an additional portion of the extraction channel, a portion of the primary distribution channel, and a portion of the secondary distribution channel, wherein the portion of the extraction channel extends between the portion of the primary distribution channel and the top surface, and
        a third plate including an additional portion of the primary distribution channel and an additional portion of the secondary distribution channel, wherein the first plate, the second plate, and the third plate are configured to couple to one another to form the extraction channel, the primary distribution channel, and the secondary distribution channel; and
    a component coupled to the top surface of the cooling cassette proximate to the cooling cavity such that the component defines a boundary of the cooling cavity, and wherein coolant flowing through the cooling cassette from the inlet to the outlet contacts the component at the cooling cavity,
    wherein the power supply is configured to supply power to a torch of the welding or cutting system.

2. The power supply of claim 1, wherein coolant flowing through the cooling cassette directly contacts the component to provide a cooling effect to regulate a temperature of the component.

3. The power supply of claim 1, further comprising:
    a seal disposed around the cooling cavity and disposed between the top surface of the cooling cassette and the component.

4. The power supply of claim 1, wherein the cooling cavity is a first cooling cavity, the cooling cassette further including:
    a second cooling cavity disposed within the top surface of the cooling cassette and spaced from the first cooling cavity, the second cooling cavity being in fluid communication with the inlet and the outlet.

5. The power supply of claim 4, wherein the component is a first component, the power supply further comprising:
a second component coupled to the top surface of the cooling cassette proximate to the second cooling cavity such that the second component defines a boundary of the second cooling cavity.

6. The power supply of claim 5, wherein the secondary distribution channel is a first secondary distribution channel fluidly coupled to the first cooling cavity and to the primary distribution channel to direct coolant from the primary distribution channel into the first cooling cavity, the cooling cassette includes a second secondary distribution channel fluidly coupled to the second cooling cavity and to the primary distribution channel to direct coolant from the primary distribution channel into the second cooling cavity such that coolant flowing through the cooling cassette from the inlet to the outlet provides parallel cooling of the first component and the second component, and the second secondary distribution channel is fluidly coupled to the primary distribution channel downstream of the first secondary distribution channel relative to a direction of coolant flow through the primary distribution channel.

7. The power supply of claim 4, wherein the extraction channel is a first extraction channel fluidly coupled to the first cooling cavity, the cooling cassette includes a second extraction channel fluidly coupled to the second cooling cavity to direct coolant out of the second cooling cavity, the first extraction channel comprises a first curved segment extending from the first cooling cavity and a first linear segment extending from the first curved segment, the second extraction channel comprises a second curved segment extending from the second cooling cavity and a second linear segment extending from the second curved segment, and the second curved segment of the second extraction channel is connected to the first linear segment of the first extraction channel.

8. The power supply of claim 1, wherein the portion of the extraction channel extends between the portion of the secondary distribution channel and the top surface.

9. The power supply of claim 1, wherein the power supply is configured to supply gas to the torch of the welding or cutting system.

10. The power supply of claim 1, wherein the extraction channel comprises:
a first segment extending from the cooling cavity along the first plate and along the second plate, wherein the first segment extends transverse to the primary distribution channel and the secondary distribution channel; and
a second segment extending from the first segment along the first plate and along the second plate, wherein the second segment extends along the primary distribution channel.

11. A power supply for a welding or cutting system, the power supply comprising:
a cooling plate defining a flow pathway, an exposed portion of the flow pathway being disposed at an outer surface of the cooling plate, wherein the cooling plate comprises:
an inlet,
an outlet,
a primary distribution channel configured to receive coolant from the inlet and direct coolant toward the exposed portion of the flow pathway,
a first plate including the exposed portion of the flow pathway, the inlet, and the outlet, wherein the first plate does not include any part of the primary distribution channel,
a second plate including a portion of the primary distribution channel, and
a third plate including an additional portion of the primary distribution channel, wherein the first plate, the second plate, and the third plate are configured to couple to one another to form the flow pathway through the inlet, the primary distribution channel, the exposed portion of the flow pathway, and the outlet, and the second plate is positioned between the first plate and the third plate; and
a component coupled to the outer surface proximate to the exposed portion of the flow pathway such that the component at least partially defines the exposed portion of the flow pathway with the cooling plate, and wherein coolant flowing through the flow pathway of the cooling plate is in contact with the component at the exposed portion of the flow pathway,
wherein the power supply is configured to supply power to a torch of the welding or cutting system.

12. The power supply of claim 11, wherein the exposed portion of the flow pathway is a first exposed portion, and the cooling plate further includes:
a second exposed portion of the flow pathway that is disposed at the outer surface of the cooling plate such that the second exposed portion is spaced from the first exposed portion of the flow pathway.

13. The power supply of claim 12, wherein the component is a first component, the power supply further comprising:
a second component coupled to the outer surface of the cooling plate proximate to the second exposed portion of the flow pathway such that the second component at least partially defines the second exposed portion of the flow pathway with the cooling plate, wherein coolant flowing through the flow pathway of the cooling plate is in contact with the second component at the second exposed portion of the flow pathway.

14. The power supply of claim 13, wherein coolant flowing through the flow pathway provides parallel cooling of the first component and the second component.

15. A power supply for a welding or cutting system, the power supply comprising:
a cooling plate comprising:
an outer surface;
an inlet;
an outlet;
a cooling chamber disposed within the outer surface and fluidly coupled to the inlet and the outlet;
a distribution channel fluidly coupled to the cooling chamber to direct coolant from the inlet toward the cooling chamber;
an extraction channel fluidly coupled to the cooling chamber to direct coolant out of the cooling chamber and toward the outlet;
a first plate including the cooling chamber, a portion of the extraction channel, the inlet, and the outlet;
a second plate including an additional portion of the extraction channel and a portion of the distribution channel, wherein the portion of the extraction channel extends between the portion of the distribution channel and the outer surface; and
a third plate including an additional portion of the distribution channel, wherein the first plate, the second plate, and the third plate are configured to couple to one another to form the extraction channel and the distribution channel, and the second plate is positioned between the first plate and the third plate; and a component coupled to the outer surface of the cooling plate over the cooling chamber, wherein coolant flowing through the cooling chamber contacts the portion of the component to regulate a temperature of the component, and wherein the power supply is configured to supply power to a torch of the welding or cutting system.

16. The power supply of claim 15, wherein the cooling chamber is a first cooling chamber, and the cooling plate further includes:

a second cooling chamber disposed within the outer surface of the cooling plate and spaced from the first cooling chamber.

17. The power supply of claim 16, wherein the component is a first component, the power supply further comprising:

a second component coupled to the outer surface of the cooling plate over the second cooling chamber such that coolant flowing through the second cooling chamber of the cooling plate is in contact with the second component.

18. The power supply of claim 17, wherein coolant flowing through the first cooling chamber and through the second cooling chamber provides parallel temperature regulation of the first component and the second component.

19. The power supply of claim 15, wherein the component is a power module of the power supply.

* * * * *